(12) United States Patent
Trang et al.

(10) Patent No.: US 11,424,333 B2
(45) Date of Patent: *Aug. 23, 2022

(54) DRAIN AND/OR GATE INTERCONNECT AND FINGER STRUCTURE

(71) Applicant: Wolfspeed, Inc., Durham, NC (US)

(72) Inventors: Frank Trang, San Jose, CA (US); Zulhazmi Mokhti, Morgan Hill, CA (US); Haedong Jang, San Jose, CA (US)

(73) Assignee: WolfSpeed, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/998,287

(22) Filed: Aug. 20, 2020

(65) Prior Publication Data

US 2020/0381527 A1 Dec. 3, 2020

Related U.S. Application Data

(63) Continuation of application No. 16/375,398, filed on Apr. 4, 2019, now Pat. No. 10,763,334, which is a
(Continued)

(51) Int. Cl.
*H01L 23/52* (2006.01)
*H01L 29/423* (2006.01)
(Continued)

(52) U.S. Cl.
CPC ...... *H01L 29/42316* (2013.01); *H01L 23/528* (2013.01); *H01L 23/5226* (2013.01);
(Continued)

(58) Field of Classification Search
CPC .......... H01L 29/41758; H01L 23/5226; H01L 23/528; H01L 23/4824
See application file for complete search history.

(56) References Cited

U.S. PATENT DOCUMENTS 4,498,093 A 2/1985 Allyn
4,721,986 A 1/1988 Kinzer
(Continued)

FOREIGN PATENT DOCUMENTS

JP 06-043970 6/1994
JP 2002299351 A 10/2002
(Continued)

OTHER PUBLICATIONS

Notification Concerning Transmittal of International Preliminary Report on Patentability, dated Jun. 17, 2021, for corresponding International Application No. PCT/US2019/063961.
(Continued)

*Primary Examiner* — Nicholas J Tobergte
(74) *Attorney, Agent, or Firm* — Myers Bigel, P.A.

(57) ABSTRACT

Pursuant to some embodiments of the present invention, transistor devices are provided that include a semiconductor structure, a gate finger extending on the semiconductor structure in a first direction, and a gate interconnect extending in the first direction and configured to be coupled to a gate signal at an interior position of the gate interconnect, where the gate interconnect is connected to the gate finger at a position offset from the interior position of the gate interconnect.

20 Claims, 25 Drawing Sheets

Related U.S. Application Data continuation-in-part of application No. 16/032,571, filed on Jul. 11, 2018, now Pat. No. 10,483,352.

(51) Int. Cl.
| | | |
|---|---|---|
| *H01L 23/522* | (2006.01) | |
| *H01L 23/528* | (2006.01) | |
| *H01L 29/06* | (2006.01) | |
| *H01L 29/08* | (2006.01) | |
| *H01L 29/417* | (2006.01) | |
| H01L 29/778 | (2006.01) | |
| H01L 29/78 | (2006.01) | |

(52) U.S. Cl.
CPC ...... *H01L 29/0696* (2013.01); *H01L 29/0847* (2013.01); *H01L 29/41758* (2013.01); *H01L 29/778* (2013.01); *H01L 29/7816* (2013.01)

(56) References Cited

U.S. PATENT DOCUMENTS

| | | |
|---|---|---|
| 5,025,296 A | 6/1991 | Fullerton |
| 5,430,247 A | 7/1995 | Bockelman |
| 5,500,522 A | 3/1996 | Eshraghian |
| 5,592,006 A | 1/1997 | Merrill |
| 5,744,843 A | 4/1998 | Efland et al. |
| 6,023,086 A | 2/2000 | Reyes |
| 6,274,896 B1 | 8/2001 | Gibson |
| 6,316,793 B1 | 11/2001 | Sheppard |
| 6,507,047 B2 | 1/2003 | Litwin |
| 6,765,268 B2 | 7/2004 | Akamine |
| 6,900,482 B2 | 5/2005 | Aoki |
| 7,135,747 B2 | 11/2006 | Allen |
| 7,851,832 B2 | 12/2010 | Takagi |
| 7,906,799 B2 | 3/2011 | Sheppard |
| 8,076,994 B2 | 12/2011 | Farrell |
| 8,178,908 B2 | 5/2012 | Greenberg |
| 8,536,622 B2 | 9/2013 | Takemae |
| 8,860,093 B2 | 10/2014 | Sasaki |
| 8,866,197 B2 | 10/2014 | Becker |
| 8,872,279 B2 | 10/2014 | Greenberg et al. |
| 9,190,479 B1 | 11/2015 | Greenberg |
| 9,564,861 B2 | 2/2017 | Zhao et al. |
| 9,607,953 B1 | 3/2017 | Li et al. |
| 9,653,410 B1 | 5/2017 | Holmes et al. |
| 9,741,673 B2 | 8/2017 | Andre |
| 9,786,660 B1 | 10/2017 | Farrell |
| 9,979,361 B1 | 5/2018 | Mangaonkar et al. |
| 10,270,402 B1 | 4/2019 | Holmes et al. |
| 10,483,352 B1 | 11/2019 | Mokhti et al. |
| 10,600,746 B2 | 3/2020 | Trang et al. |
| 10,763,334 B2 * | 9/2020 | Trang ................. H01L 23/5226 |
| 2001/0012671 A1 | 8/2001 | Hoshino |
| 2002/0033508 A1 | 3/2002 | Morikawa |
| 2002/0039038 A1 | 4/2002 | Miyazawa |
| 2002/0066908 A1 | 6/2002 | Smith |
| 2002/0167023 A1 | 11/2002 | Chavarkar |
| 2003/0013276 A1 | 1/2003 | Asano et al. |
| 2003/0102482 A1 | 6/2003 | Saxler |
| 2004/0061129 A1 | 4/2004 | Saxler |
| 2005/0133829 A1 | 6/2005 | Kunii et al. |
| 2006/0081985 A1 | 4/2006 | Beach |
| 2008/0100404 A1 | 5/2008 | Vice |
| 2008/0149940 A1 | 6/2008 | Shibata et al. |
| 2008/0157222 A1 | 7/2008 | Wang |
| 2009/0020848 A1 | 1/2009 | Ono |
| 2009/0108357 A1 | 4/2009 | Takagi |
| 2009/0212846 A1 | 8/2009 | Cutter |
| 2009/0278207 A1 | 11/2009 | Greenberg |
| 2011/0018631 A1 | 1/2011 | Ng |
| 2011/0102077 A1 | 5/2011 | Lamey |
| 2012/0012908 A1 | 1/2012 | Matsunaga |
| 2012/0199847 A1 | 8/2012 | Takagi |
| 2012/0267795 A1 | 10/2012 | Shimura |
| 2013/0099286 A1 | 4/2013 | Imada |
| 2013/0228787 A1 | 9/2013 | Yamamura |
| 2013/0313653 A1 | 11/2013 | Brech |
| 2014/0014969 A1 | 1/2014 | Kunii |
| 2015/0129965 A1 | 5/2015 | Roy |
| 2015/0145025 A1 | 5/2015 | Yoshida et al. |
| 2015/0243657 A1 | 8/2015 | Lin et al. |
| 2015/0311131 A1 | 10/2015 | Watts et al. |
| 2015/0333051 A1 | 11/2015 | Greenberg et al. |
| 2015/0349727 A1 | 12/2015 | Flowers et al. |
| 2016/0380606 A1 | 12/2016 | Limjoco et al. |
| 2017/0154839 A1 | 6/2017 | Lin et al. |
| 2017/0221878 A1 | 8/2017 | Risaki |
| 2017/0271329 A1 | 9/2017 | Farrell |
| 2017/0271497 A1 | 9/2017 | Fayed |
| 2018/0026125 A1 | 1/2018 | Liao et al. |
| 2018/0047822 A1 | 2/2018 | Lin et al. |
| 2018/0190814 A1 | 7/2018 | Pendharkar et al. |
| 2018/0261566 A1 | 9/2018 | Babcock et al. |
| 2020/0027850 A1 | 1/2020 | Trang et al. |
| 2020/0075479 A1 | 3/2020 | Khalil et al. |

FOREIGN PATENT DOCUMENTS

| | | |
|---|---|---|
| JP | 2006156902 A | 6/2006 |
| JP | 2007173731 A | 7/2007 |
| JP | 2010147254 A | 7/2010 |
| JP | 2011524079 A | 8/2011 |
| JP | 2013247618 | 12/2013 |
| KR | 20170038020 A | 4/2017 |
| WO | 2014097524 A1 | 6/2014 |

OTHER PUBLICATIONS

Notification of Transmittal of the International Search Report and the Written Opinion of the International Searching Authority, or the Declaration, dated Sep. 14, 2020, for corresponding PCT International Application No. PCT/US2020/029442.

Notification of Transmittal of the International Search Report and the Written Opinion of the International Searching Authority, or the Declaration, dated Mar. 16, 2020, for corresponding PCT International Application No. PCT/US2019/063961.

Notification Concerning Transmittal of International Preliminary Report on Patentability, dated Jan. 21, 2021, for corresponding International Application No. PCT/US2019/040960.

* cited by examiner

DRAIN AND/OR GATE INTERCONNECT AND FINGER STRUCTURE

CROSS-REFERENCE TO RELATED APPLICATIONS

This application is a continuation of U.S. application Ser. No. 16/375,398 filed Apr. 4, 2019, which is a continuation-in-part application of, and claims priority to, U.S. application Ser. No. 16/032,571, filed Jul. 11, 2018, the entire contents of which are incorporated by reference herein.

FIELD

The inventive concepts described herein relate to microelectronic devices and, more particularly, to high power, high frequency transistors having unit cell-based structures.

BACKGROUND

Electrical circuits requiring high power handling capability while operating at high frequencies, such as radio frequencies (500 MHz), S-band (3 GHz), and X-band (10 GHz), have in recent years become more prevalent. Because of the increase in high power, high frequency circuits, there has been a corresponding increase in demand for transistors which are capable of reliably operating at radio and microwave frequencies while still being capable of handling higher power loads.

To provide increased output power, transistors with larger gate peripheries have been developed. One technique for increasing the effective gate periphery of a transistor is to provide a plurality of transistor cells that are connected in parallel in a unit cell configuration. For example, a high power transistor may include a plurality of gate fingers that extend in parallel between respective elongated source and drain contacts, as illustrated in FIG. 1.

In particular, FIG. 1 illustrates a metal layout of a conventional semiconductor transistor device 10 that includes a gate pad 12 and a drain pad 32 on a semiconductor substrate 20. FIG. 1 is a plan view of the device (i.e., looking down at the device from above). As shown in FIG. 1, in the conventional semiconductor transistor device 10, the gate pad 12 is connected by a gate bus 14 to a plurality of parallel gate fingers 16 that are spaced apart from each other along a first direction (e.g., the Y-direction indicated in FIG. 1) and extend in a second direction (e.g., the X-direction indicated in FIG. 1). The drain pad 32 is connected to a plurality of drain contacts 36 via a drain bus 34. In addition, source contacts 26 may also be located on the semiconductor transistor device 10. Each gate finger 16 runs along the X-direction between a pair of adjacent source and drain contacts 26, 36. A unit cell of the semiconductor transistor device 10 is illustrated at box 40, and includes a gate finger 16 that extends between adjacent source and drain contacts 26, 36. The "gate length" refers to the distance of the gate metallization in the Y-direction, while the "gate width" is the distance by which the source and drain contacts 26, 36 overlap in the X-direction. That is, "width" of a gate finger 16 refers to the dimension of the gate finger 16 that extends in parallel to the adjacent source/drain contacts 26, 36 (the distance along the X-direction). The gate periphery of the device refers to the sum of the gate widths for each gate finger 16 of the semiconductor transistor device 10.

In addition to adding unit cells, the gate periphery of a multi-cell transistor device may be increased by making the gate fingers wider (i.e., longer in the X-direction). As the gate fingers of a device become wider, however, the high frequency performance of the device may be adversely impacted. In addition, making the gate fingers wider typically means that the gate fingers must handle increased current levels, which can cause electromigration of the gate finger metallization.

SUMMARY

Pursuant to some embodiments of the present invention, transistor devices are provided that include a semiconductor structure, a gate finger extending on the semiconductor structure in a first direction, and a gate interconnect extending in the first direction and configured to be coupled to a gate signal at an interior position of the gate interconnect, where the gate interconnect is connected to the gate finger at a position offset from the interior position of the gate interconnect.

In some embodiments, the gate finger comprises edge portions at opposite edges of the gate finger with a central portion between the edge portions, and the gate interconnect is connected to the edge portions of the gate finger via a plurality of conductive vias.

In some embodiments, the gate finger is free of a conductive via connected to the central portion of the gate finger.

In some embodiments, the edge portions are within one-third of a width in the first direction of the gate finger from respective opposite edges of the gate finger.

In some embodiments, the gate interconnect is connected to the gate finger at a first location on the gate finger that is adjacent a first edge of the gate finger and at a second location on the gate finger that is adjacent a second edge of the gate finger.

In some embodiments, the device further includes a gate runner extending on the semiconductor structure in the first direction, where the gate interconnect has a first end and a second end, and the gate interconnect is connected to the gate runner at the interior position of the gate interconnect that is remote from the first end and the second end of the gate interconnect.

In some embodiments, the gate finger extends on the semiconductor structure at a first level above the semiconductor structure, the gate interconnect extends on the semiconductor structure at a second level above the semiconductor structure that is higher than the first level, and the gate runner extends on the semiconductor structure at a third level above the semiconductor structure that is equal to or higher than the second level.

In some embodiments, the gate finger comprises a first segment and a second segment with a gap therebetween.

In some embodiments, the device further includes a drain finger extending on the semiconductor structure in the first direction, and a drain interconnect extending in the first direction and configured to be coupled to a drain signal at an interior position of the drain interconnect, wherein the drain interconnect is connected to the drain finger by a plurality of conductive vias.

In some embodiments, the position offset from the interior position of the gate interconnect is offset from the interior position of the gate interconnect by a first offset and offset from an edge of the gate finger by a second offset and the first offset is greater than the second offset.

Pursuant to some embodiments of the present invention, transistor devices are provided that include a semiconductor structure, a drain finger extending on the semiconductor structure in a first direction, and a drain interconnect extending in the first direction and configured to be coupled to a drain signal at an interior position of the drain interconnect, where the drain interconnect is connected to the drain finger at a position offset from the interior position of the drain interconnect.

In some embodiments, the drain finger comprises edge portions at opposite edges of the drain finger with a central portion between the edge portions, and the drain interconnect is connected to the edge portions of the drain finger via a plurality of conductive vias.

In some embodiments, the drain finger is free of a conductive via connected to the central portion of the drain finger.

In some embodiments, the edge portions are within one-third of a width in the first direction of the drain finger from respective opposite edges of the drain finger.

In some embodiments, the drain interconnect is connected to the drain finger at a first location on the drain finger that is adjacent a first edge of the drain finger and at a second location on the drain finger that is adjacent a second edge of the drain finger.

In some embodiments, the device further includes a drain runner extending on the semiconductor structure in the first direction, where the drain interconnect has a first end and a second end, and the drain interconnect is connected to the drain runner at the interior position of the drain interconnect that is remote from the first end and the second end of the drain interconnect.

In some embodiments, the drain finger extends on the semiconductor structure at a first level above the semiconductor structure, the drain interconnect extends on the semiconductor structure at a second level above the semiconductor structure that is higher than the first level, and the drain runner extends on the semiconductor structure at a third level above the semiconductor structure that is equal to or higher than the second level.

In some embodiments, the device further includes a gate finger extending on the semiconductor structure in the first direction, and a gate interconnect extending in the first direction and configured to be coupled to a gate signal at an interior position of the gate interconnect, where the gate interconnect is connected to the gate finger by a plurality of conductive vias.

In some embodiments, the position that is offset from the interior position of the drain interconnect is offset from the interior position of the drain interconnect by a first offset and offset from an edge of the drain finger by a second offset, and the first offset is greater than the second offset.

Pursuant to some embodiments of the present invention, transistor devices are provided that include a semiconductor structure, and a plurality of gate fingers and a plurality of drain fingers alternately arranged on the semiconductor structure, each extending in a first direction. A gate finger of the plurality of gate fingers and a drain finger of the plurality of drain fingers comprise respective edge portions at opposite edges thereof with a central portion between the respective edge portions, one of the gate finger or the drain finger has a plurality of conductive vias connected to the respective edge portions thereof and is free of a conductive via connected to the central portion, and the other of the gate finger or the drain finger has at least one conductive via connected to the central portion thereof.

In some embodiments, the respective edge portions are within one-third of a width in the first direction of the gate finger or drain finger from the opposite edges of the gate finger or drain finger.

In some embodiments, the device further includes a plurality of gate interconnects on the semiconductor structure, respective ones of the plurality of gate interconnects coupled to respective ones of the plurality of gate fingers, and a plurality of gate runners extending on the semiconductor structure. Each of the plurality of gate interconnects has a first end and a second end, and at least one of the gate interconnects is connected to one of the gate runners at an interior position of the at least one of the gate interconnects that is remote from the first end and the second end of the at least one of the gate interconnects.

In some embodiments, the device further includes a plurality of source regions and a plurality of drain regions alternately arranged on the semiconductor structure, where respective ones of the plurality of gate fingers extend between adjacent ones of the source regions and the drain regions, and the at least one of the gate runners extends on one of the source regions.

In some embodiments, the at least one of the gate runners extends in the first direction, and a first dimension of the at least one of the gate runners in a second direction, crossing the first direction, exceeds a second dimension of the at least one of the gate interconnects in the second direction.

Pursuant to some embodiments of the present invention, transistor devices are provided that include a semiconductor structure, a plurality of gate fingers extending at a first level above the semiconductor structure, a plurality of drain fingers extending at a second level above the semiconductor structure, a plurality of gate interconnects on the semiconductor structure at a third level above the semiconductor structure that is higher than the first level, respective ones of the gate interconnects configured to receive a gate signal at an interior position thereof, and a plurality of drain interconnects on the semiconductor structure at a fourth level above the semiconductor structure that is higher than the first level, respective ones of the drain interconnects configured to output a drain signal at an interior position thereof, where at least one of the gate interconnects is connected to a respective gate finger of the plurality of gate fingers at opposite ends of the gate finger or at least one of the drain interconnects is connected to a respective drain finger of the plurality of drain fingers at opposite ends of the drain finger.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
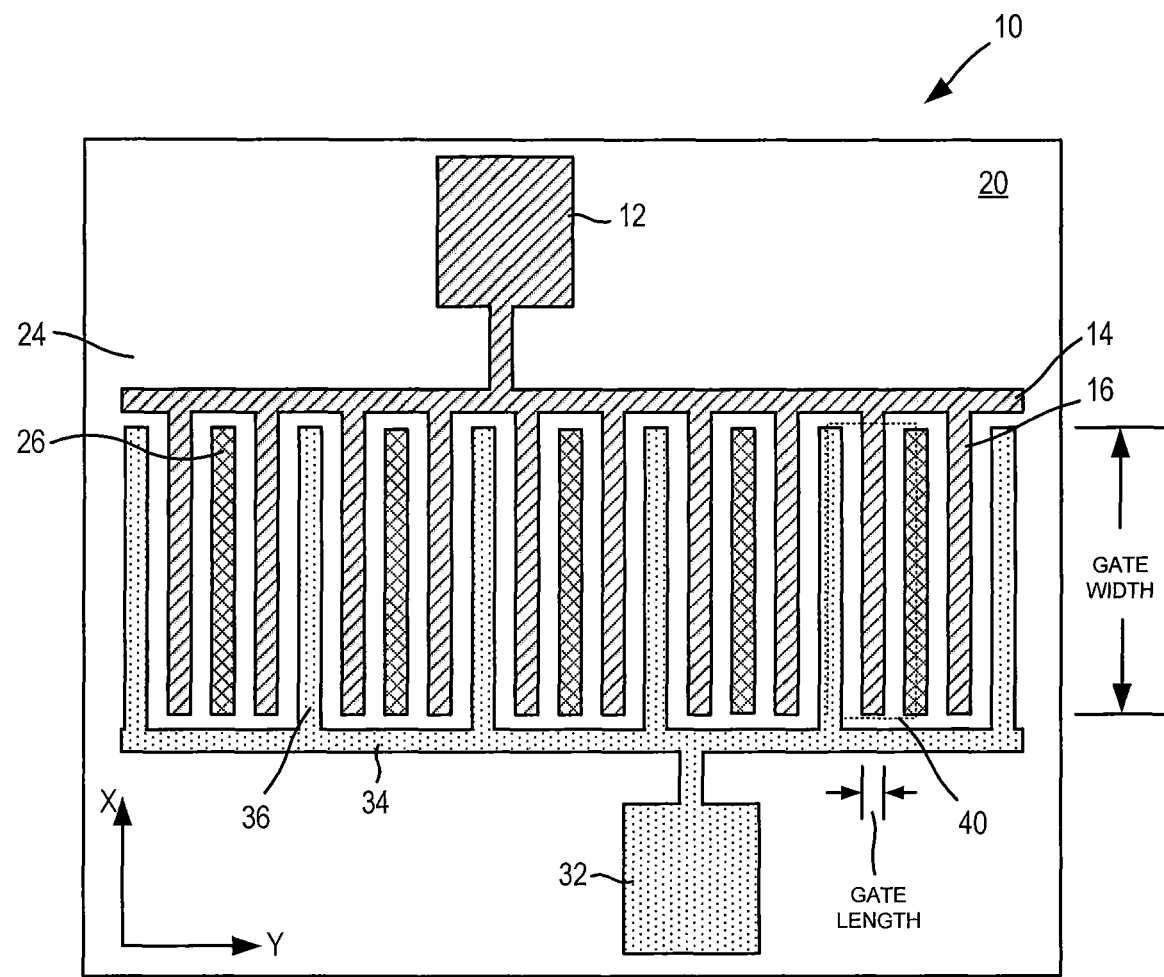
FIG. 1 is a plan view of a metal layout of a conventional multi-cell transistor.

Embodiments of the present inventive concepts are described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the inventive concepts provide multi-cell transistor devices with large effective gate widths. By feeding the gate signal to the gate fingers at an interior position of the gate interconnect, such as a midpoint of a gate interconnect, large phase differences that can occur due to the gate signal propagating across the full length of a long gate finger may be reduced and/or avoided. According to some embodiments, a larger gate width of a multi-cell transistor device can be accommodated by adding a gate runner above a gate interconnect, with a conductive via coupling the gate runner to an interior position on the gate interconnect. The connection of the gate runner to the interior position of the gate interconnect may serve to divide the gate finger into multiple segments. The gate signal may thus travel from the interior position of the gate interconnect to ends of the gate interconnect, and be provided to the gate finger with little to no phase difference in the resulting propagated gate signal.

By effectively dividing the gate finger into segments and distributing the gate signal to each of the gate finger segments by means of a gate runner, the gain performance of the transistor may be increased as compared to conventional devices.

In accordance with an aspect of the present invention, additional benefits may be achieved when the gate signal is fed to an interior portion of a gate interconnect, and the gate interconnect is coupled to respective ones of the gate finger segments offset from where the gate signal is fed to the gate interconnect. In some embodiments, the gate signal is fed to respective ones of the gate finger segments at a position adjacent an edge of the gate finger segments, or offset from the edge by a small amount. Feeding the gate signal to the gate finger segments at, or near, edges of the gate finger segments may allow for the individual segments to perform as if they are wired electrically in parallel.

Depending on the embodiment, the signal provided to the drain finger may continue to be provided at interior locations. As will be discussed herein, providing the gate signal to the edges of the gate finger segments may improve a resulting output signal from the transistor device by improving a phase relation between the gate and drain signals.

For example, two portions of a gate finger lined in series may be fed at the two opposite edges to behave like they were lined in parallel. At the same time, the drain may be fed at an interior position. This configuration may provide advantages in that it allows each long finger of the transistor to operate as a pair of short fingers in parallel, but without doubling the number of fingers. This retains the benefit of lower gate resistance, producing a higher gain while producing the same high power. In addition, a configuration combining edge-fed gate fingers with center-fed drain fingers follows the energy propagation direction and ensures that the current summation is done in-phase. This will contribute in preserving the RF performance of shorter fingers in terms of output power density and efficiency.

In accordance with an aspect of the present invention, a drain signal is fed to an interior portion of a drain interconnect, and the drain interconnect is coupled to respective ones of drain finger segments offset from where the drain signal is fed to the drain interconnect. In some embodiments, the drain signal is fed to respective ones of the drain finger segments at a position adjacent an edge of the drain finger segments, or offset from the edge by a small amount. Feeding the drain signal to the drain finger segments at, or near, edges of the drain finger segments may allow for the individual segments to perform as if they are wired electrically in parallel. In some embodiments, the gate and drain segments are respectively fed from positions that are offset from the interior position where the drain and gate interconnects are respectively fed the drain and gate signals.

Thus, in some embodiments, transistors are provided that include a semiconductor structure, a plurality of gate fingers extending on the semiconductor structure in a first direction, a respective gate finger having a first edge and a second edge on an opposite side of the gate finger from the first edge in the first direction, and a plurality of gate interconnects, a respective gate interconnect connected to the respective gate finger at a first position adjacent the first edge and a second position adjacent the second edge of the respective gate finger, the respective gate interconnect configured to receive a gate signal at an interior position in a central portion of the gate interconnect.

In some embodiments, transistors are provided that include a semiconductor structure, a plurality of gate fingers extending at a first level above the semiconductor structure, a plurality of drain fingers extending at a second level above the semiconductor structure, a plurality of gate interconnects on the semiconductor structure at a third level above the semiconductor structure that is higher than the first level, respective ones of the gate interconnects configured to receive a gate signal at an interior position thereof, and a plurality of drain interconnects on the semiconductor structure at a fourth level above the semiconductor structure that is higher than the first level, respective ones of the drain interconnects configured to output a drain signal at an interior position thereof, where at least one of the gate interconnects is connected to a respective gate finger of the plurality of gate fingers at opposite ends of the gate finger or at least one of the drain interconnects is connected to a respective drain finger of the plurality of drain fingers at opposite ends of the drain finger.

In some embodiments, transistors are provided that include a semiconductor structure, and a plurality of gate fingers and a plurality of drain fingers alternately arranged on the semiconductor structure, each extending in a first direction. A gate finger of the plurality of gate fingers and a drain finger of the plurality of drain fingers comprise respective edge portions at opposite edges thereof with a central portion between the edge portions, one of the gate finger or the drain finger has a plurality of conductive vias connected to the edge portions thereof and is free of a conductive via connected to the central portion, and the other of the gate finger or the drain finger has at least one conductive via connected to the central portion thereof.

In some embodiments, transistors are provided that include a semiconductor structure, a gate finger extending on the semiconductor structure in a first direction, and a gate interconnect extending in the first direction and configured to receive a gate signal at an interior position of the gate interconnect, wherein the gate interconnect is connected to the gate finger at a remote position of the gate interconnect that is remote from the interior position.

Embodiments of the present invention will now be described in greater detail with reference to FIGS. 2A-11.

As discussed in the Background section, one technique for increasing the effective gate periphery of a transistor is to provide a plurality of unit cell transistors that are connected in parallel. Such a plurality of unit cell transistors may be used in applications involving high frequency and/or high power. For example, base stations may use RF power amplifiers in the final stage of signal amplification to generate the high output power required for coverage of the cell. An important element in these RF power amplifiers, as well as similar applications, is the unit cell transistors that produce the amplification mechanism.

Figure 2A:
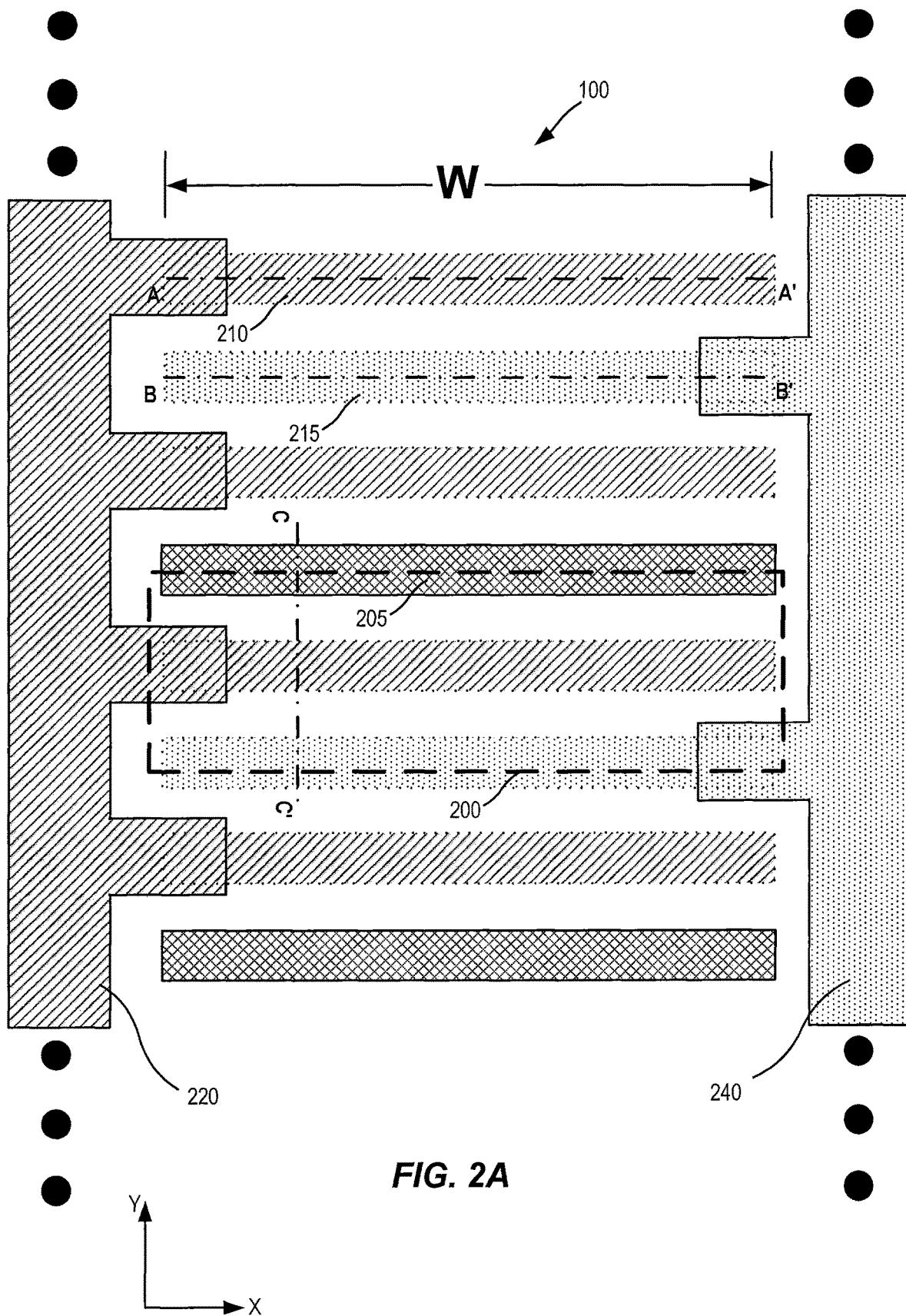
FIG. 2A is a plan view illustrating embodiments of a multi-cell transistor utilizing gate and drain runners.
Figure 2B:
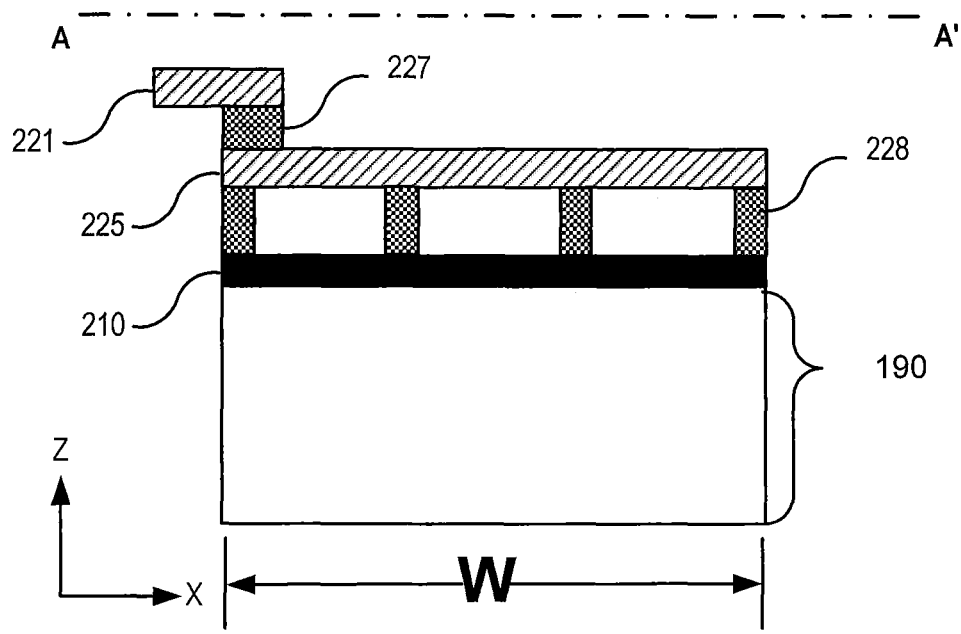
FIG. 2B is a cross section of FIG. 2A taken along the line A-A'.
Figure 2C:
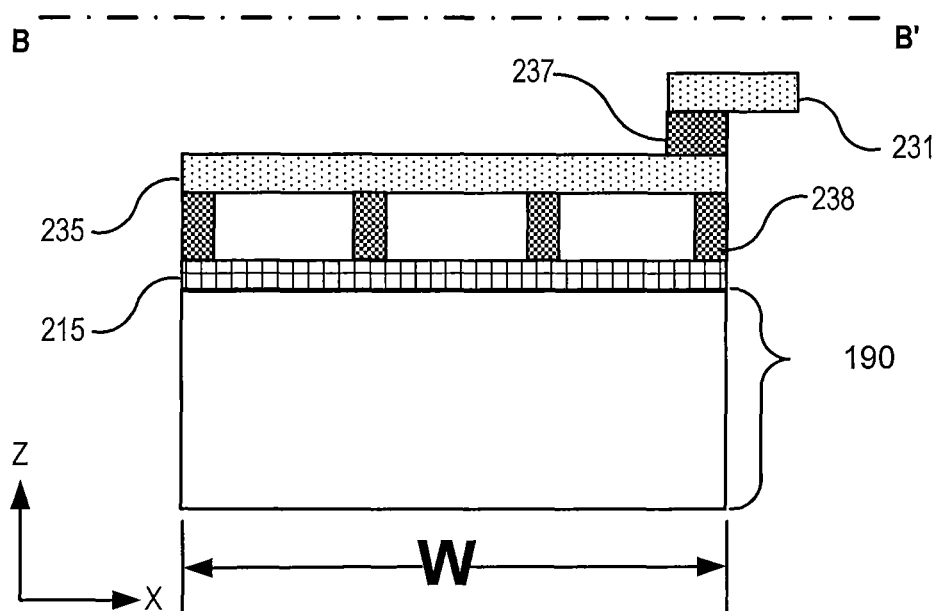
FIG. 2C is a cross section of FIG. 2A taken along the line B-B'.

FIG. 2A is a plan view illustrating embodiments of a multi-cell transistor utilizing gate and drain runners. FIG. 2B is a cross section of FIG. 2A taken along the line A-A'. FIG. 2C is a cross section of FIG. 2A taken along the line B-B'.

Referring first to FIG. 2A, a transistor device 100 is illustrated that includes a plurality of transistor cells 200. The active region of a transistor cell 200 may include a gate finger 210, a drain finger 215, and a source contact 205. During amplification, current flows between the drain finger 215 and the source contact 205, and the amount of current may be modulated by a voltage signal applied to the gate finger 210.

As illustrated in FIG. 2B, a gate signal may be provided to the transistor cell 200 via a gate finger 210. The gate finger 210 may be electrically coupled to gate regions of a transistor cell 200. Similarly, as illustrated in FIG. 2C, a drain signal may be provided to the transistor cell 200 via a drain finger 215.

The gate finger 210, a drain finger 215, and a source 205 may be formed on a semiconductor structure 190 which contains an embodiment of a transistor. More specifically, the drain finger 215, the source contact 205, and the gate finger 210, may be respectively coupled to a drain region, a source region, and a gate region (e.g., a channel) of a semiconductor implementation of a transistor cell 200. It will be understood that multiple embodiments of a semiconductor-based transistor cell 200 are possible to which the drain finger 215, the source contact 205, and the gate finger 210 of FIG. 2A may be connected. For example, the drain finger 215, the source contact 205, and the gate finger 210 may be coupled to LDMOS and/or HEMT transistor embodiments, though the present invention is not limited thereto.

Figure 3A:
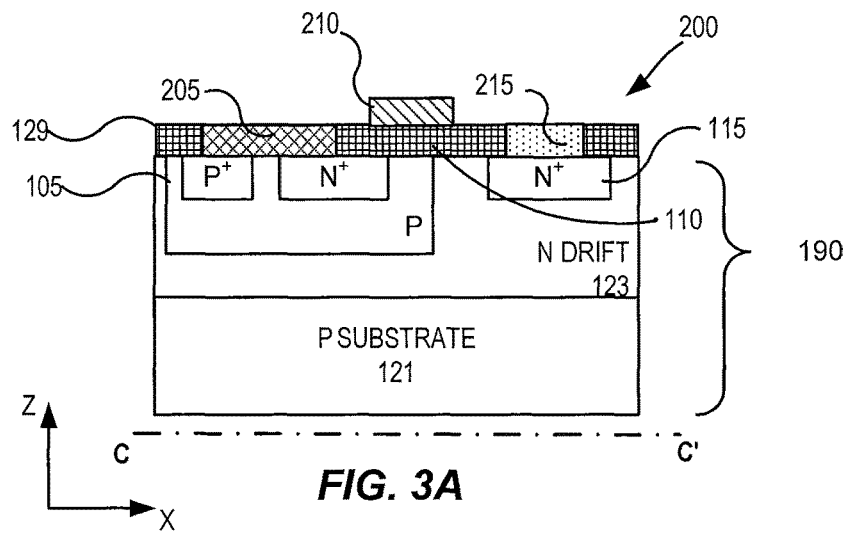
FIG. 3A is a cross section of a unit cell of a conventional laterally diffused metal oxide semiconductor (LDMOS) transistor device.

For example, FIG. 3A, which is a cross section of FIG. 2A taken along the line C-C', illustrates an implementation of the transistor cell 200 of FIG. 2A where the transistor cell is an LDMOS transistor cell. An LDMOS field effect transistor (FET) is a 3-terminal transistor device that has a source region 105 and a drain region 115 that are formed in a semiconductor structure 190. The semiconductor structure 190 includes a semiconductor substrate 121 (e.g., of p-type conductivity) and a drift layer 123 (e.g., of n-type conductivity) on the semiconductor substrate 121. The semiconductor substrate may include semiconductor and non-semiconductor substrates, including, for example, sapphire, diamond, aluminum nitride, aluminum gallium nitride, gallium nitride, silicon, silicon carbide, GaAs, LGO, ZnO, LAO, InP and the like. The LDMOS transistor cell 200 may include doped well regions providing the source region 105 and drain region 115. The source region 105, drain region 115, and gate region 110 of the LDMOS transistor cell 200 may be coupled to contacts for operation of the LDMOS transistor cell 200. For example, the gate region 110 may be electrically coupled to the gate fingers 210 that are illustrated in FIG. 2A. Similarly, drain region 115 may be electrically coupled to the drain fingers 215 illustrated in FIG. 2A.

The gate region 110 is isolated from the conducting channel by an insulator layer 129 (e.g., $SiO_2$). Applying a positive voltage to the gate region 110 with respect to the source region 105 may provide for a current to flow between drain region 115 and the source region 105 by forming an inversion layer (e.g., a channel) between the source region 105 and the drain region 115. LDMOS FETs may operate in "enhancement mode," meaning the drain-source current may not flow until an applied positive gate voltage enhances a channel across the p-well.

Figure 3B:
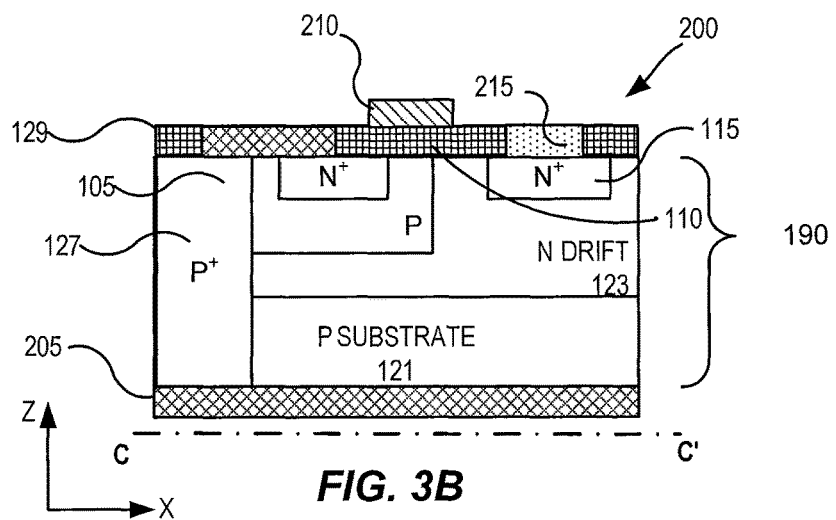
FIG. 3B is a cross section of a unit cell of a conventional LDMOS transistor device utilizing a bottom source terminal.

Though FIG. 3A illustrates the LDMOS with a contact connected to an upper surface of the source region 105 of the LDMOS transistor cell 200, it will be understood that other embodiments are possible. For example, in some embodiments, vias or other connection regions may be provided to connect the source region 105 to a contact on the bottom surface of the LDMOS device. For example, FIG. 3B is a cross section of a conventional LDMOS transistor cell 200 utilizing a bottom source contact 205. As illustrated in FIG. 3B, a laterally diffused, low-resistance p+ "sinker" 127 may connect the source region 105 to the substrate 121 and the source contact 205. When the LDMOS device of FIG. 3B is used in conjunction with a parallel transistor configuration such as that illustrated in FIG. 2A, source fingers and/or other source contacts may not be necessary on a top surface of the device. In some embodiments, source fingers similar to the gate fingers 210 and/or drain fingers 215 may be provided.

Figure 3C:
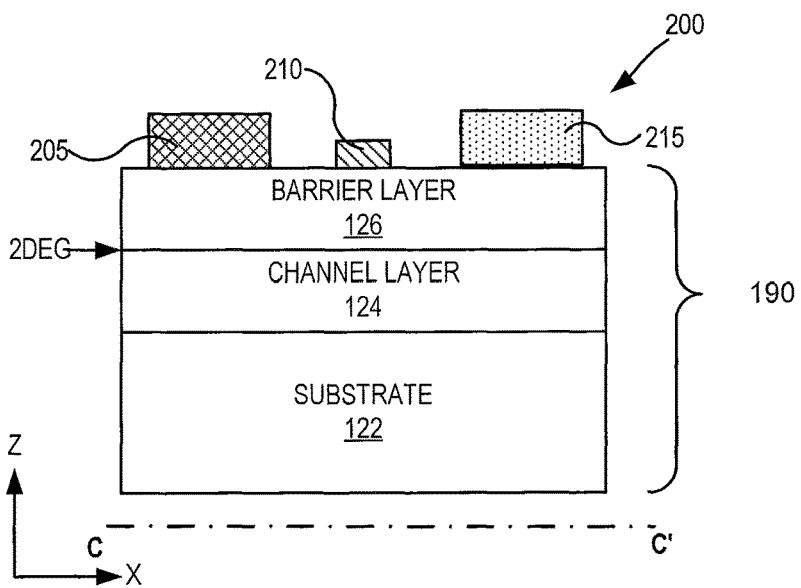
FIG. 3C is a cross section of a conventional high-electron-mobility transistor (HEMT) cell.

FIG. 3C, which is a cross section of FIG. 2A taken along the line C-C', illustrates an implementation of the transistor cell 200 of FIG. 2A where the transistor cell 200 is a HEMT transistor cell. As illustrated in FIG. 3C, a HEMT transistor cell 200 may include a semiconductor structure 190 including a substrate 122, which may, for example, include 4H-SiC or 6H-SiC. Although silicon carbide may be used as a substrate material, embodiments of the present invention may utilize any suitable substrate, such as sapphire, diamond, aluminum nitride, aluminum gallium nitride, gallium nitride, silicon, GaAs, LGO, ZnO, LAO, InP and the like. An epitaxial structure is formed on the substrate 122. The epitaxial structure may include a channel layer 124 that is formed on the substrate 122, and a barrier layer 126 that is formed on the channel layer 124. The channel layer 124 and the barrier layer 126 may include Group III-nitride based materials, with the material of the barrier layer 126 having a higher bandgap than the material of the channel layer 124. For example, the channel layer 124 may comprise GaN, while the barrier layer 126 may comprise AlGaN. While the channel layer 124 and the barrier layer 126 are illustrated as single layer structures, it will be appreciated that either or both the channel layer 124 and/or the barrier layer 126 may be implemented as multi-layer structures. It will also be appreciated that additional layers such as, for example, buffer layers, strain-balancing layers, transition layers and the like may also be included as part of the epitaxial structure provided on the substrate 122.

Due to the difference in bandgap between the barrier layer 126 and the channel layer 124 and piezoelectric effects at the interface between the barrier layer 126 and the channel layer 124, a two dimensional electron gas (2DEG) is induced in the channel layer 124 at a junction between the channel layer 124 and the barrier layer 126. The 2DEG acts as a highly conductive layer that allows conduction between the source and drain regions of the device that are beneath a source contact segment 205 and a drain finger 215, respectively. The source contact segment 205 and the drain finger 215 are formed on the barrier layer 126. A gate finger 210 is formed on the barrier layer 126 between the drain finger 215 and the source contact segment 205.

The LDMOS and HEMT devices of FIGS. 3A, 3B, and 3C are included as examples for possible configurations of a transistor cell 200. However, it will be understood that other transistor cell configurations could be utilized with the present invention without deviating from the scope of the embodiments described herein. For example, any configuration of a transistor cell 200 that may be combined with other transistor cells using a gate finger and/or drain finger may benefit from the embodiments described herein. As such, the present invention is not limited to HEMT and LDMOS transistor cells. As used herein, the term "semiconductor structure" will be used to refer to the transistor cell configurations to which the gate fingers 210 and drain fingers 215 of FIG. 2A may be connected (such as, for example, the LDMOS and HEMT examples illustrated in FIGS. 3A, 3B, and 3C).

Referring back to FIGS. 2A, 2B, and 2C, the gate finger 210 may be coupled to a gate runner 225 by a plurality of first conductive gate vias 228. In some embodiments, the gate runner 225 may be at a higher level above the semiconductor substrate than the gate finger 210. The gate runner 225 may be further connected to a gate pad 221 by a second conductive gate via 227. The gate pad 221 may be further connected to a gate manifold 220. The gate manifold 220 may provide the gate signal to a plurality of the transistor cells 200.

The drain finger 215 may be coupled to a drain runner 235 by a plurality of first conductive drain vias 238. In some embodiments, drain runner 235 may be at a higher level above the semiconductor structure 190 than the drain finger 215. The drain runner 235 may be further connected to a drain pad 231 by a second conductive drain via 237. The drain pad 231 may be further connected to a drain manifold 240. The drain manifold 240 may provide the drain signal to the plurality of transistor cells 200.

For a given fixed drain bias voltage provided to the transistor device 100, the amount of output current affects the output power of the transistor device 100. The output current is based, in part, on the total gate periphery, which is the gate finger width (W) shown in FIGS. 2A-2B multiplied by the number of gate fingers 210.

A larger gate periphery may be used to produce higher power in the transistor device 100. This higher power output may be achieved either by increasing the number of gate fingers 210, and/or by increasing the width of the gate fingers 210 (e.g., extending the gate fingers 210 in the X-direction). However, each solution has its limitations.

Figure 4:
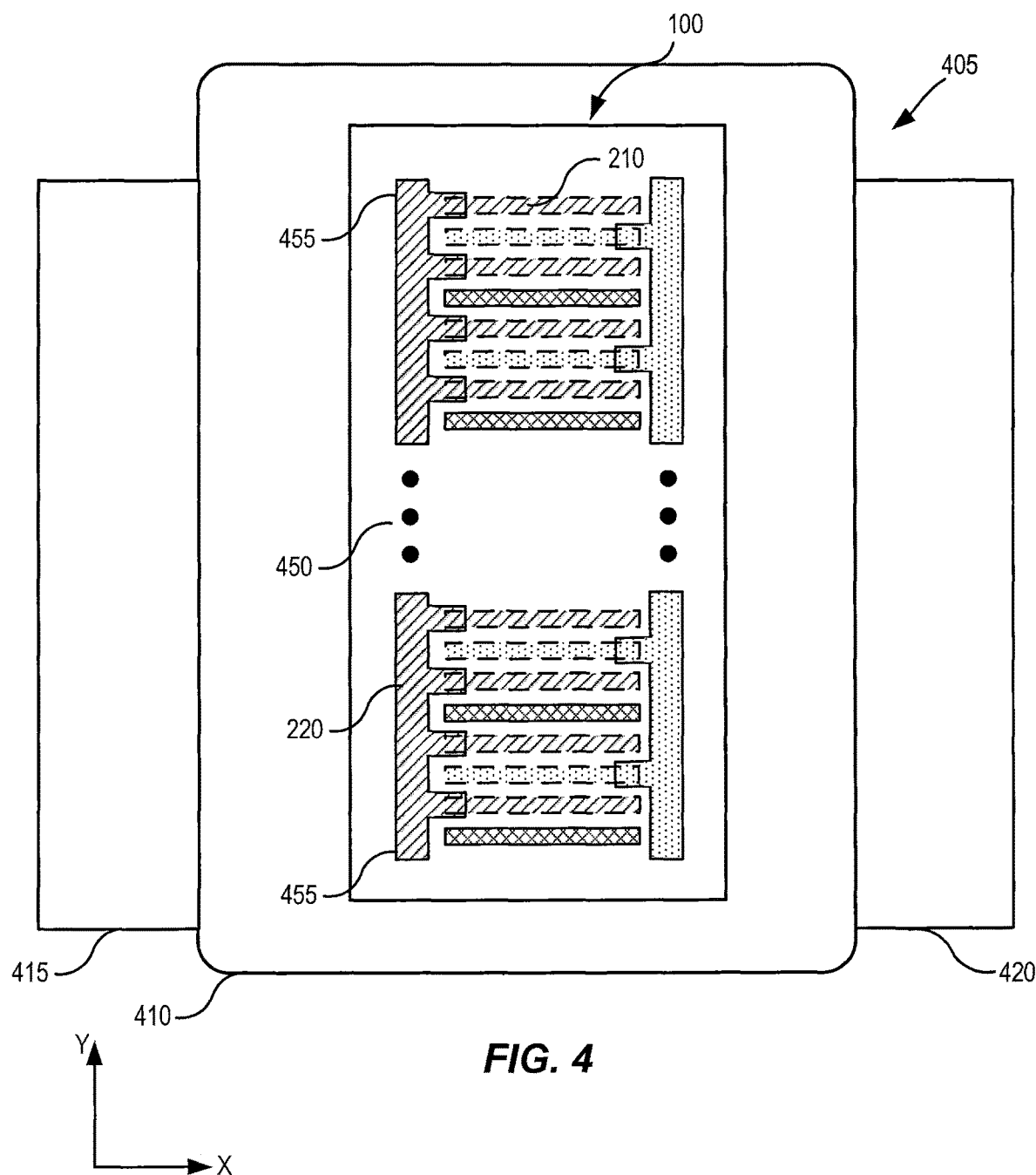
FIG. 4 is a plan view illustrating a transistor device in which a number of gate fingers is increased.

For example, increasing the number of gate fingers 210 may increase the final transistor die physical width (e.g., in the Y-direction in FIG. 2A). The physical transistor package and/or semiconductor processing equipment may therefore put a constraint on the maximum number of gate fingers 210 that may be included in the device (or alternatively, a maximum extent to which the device may extend in the Y-direction). This can be seen with reference to FIG. 4 which is a plan view of a transistor device 100 having a large number of gate fingers 210. As can be seen in FIG. 4, the size of the physical transistor package 405 may be limited by a size of a base 410 upon which the transistor device 100 is placed. The physical transistor package 405 may also be affected by the size of the package leads, such as a gate lead 415 and/or a drain lead 420.

As also illustrated in FIG. 4, another potential downside of using an increased number of gate fingers 210 in a transistor device 100 is the non-uniform signal phase distribution that may occur along the length of the gate manifold 220. The magnitude of the impact that increasing the number of gate fingers may have on the signal phase distribution and device performance may depend on the design of the transistor device. A given transistor device 100 may have a central portion 450 and end portions 455. As the length of the gate manifold 220 becomes longer, a phase difference may occur in signals, such as, for example, the gate signal transmitted to gate fingers 210, that are transmitted along the length of the gate manifold 220 (e.g., in the Y-direction). In some embodiments, the gate signal may be received from the gate lead 415 primarily at the central portion 450 of the gate manifold 220, to be distributed to the end portions 455 of the gate manifold 220. Because of differences in transmission lengths, a phase of a gate signal at an end portion 455 may differ from a phase at a central portion 450. The drain current produced at these different regions may also therefore not be summed in phase at the output (e.g., at drain lead 420), causing a degradation in the total output current magnitude and consequently, in the output power of the transistor device 100.

Figure 5A:
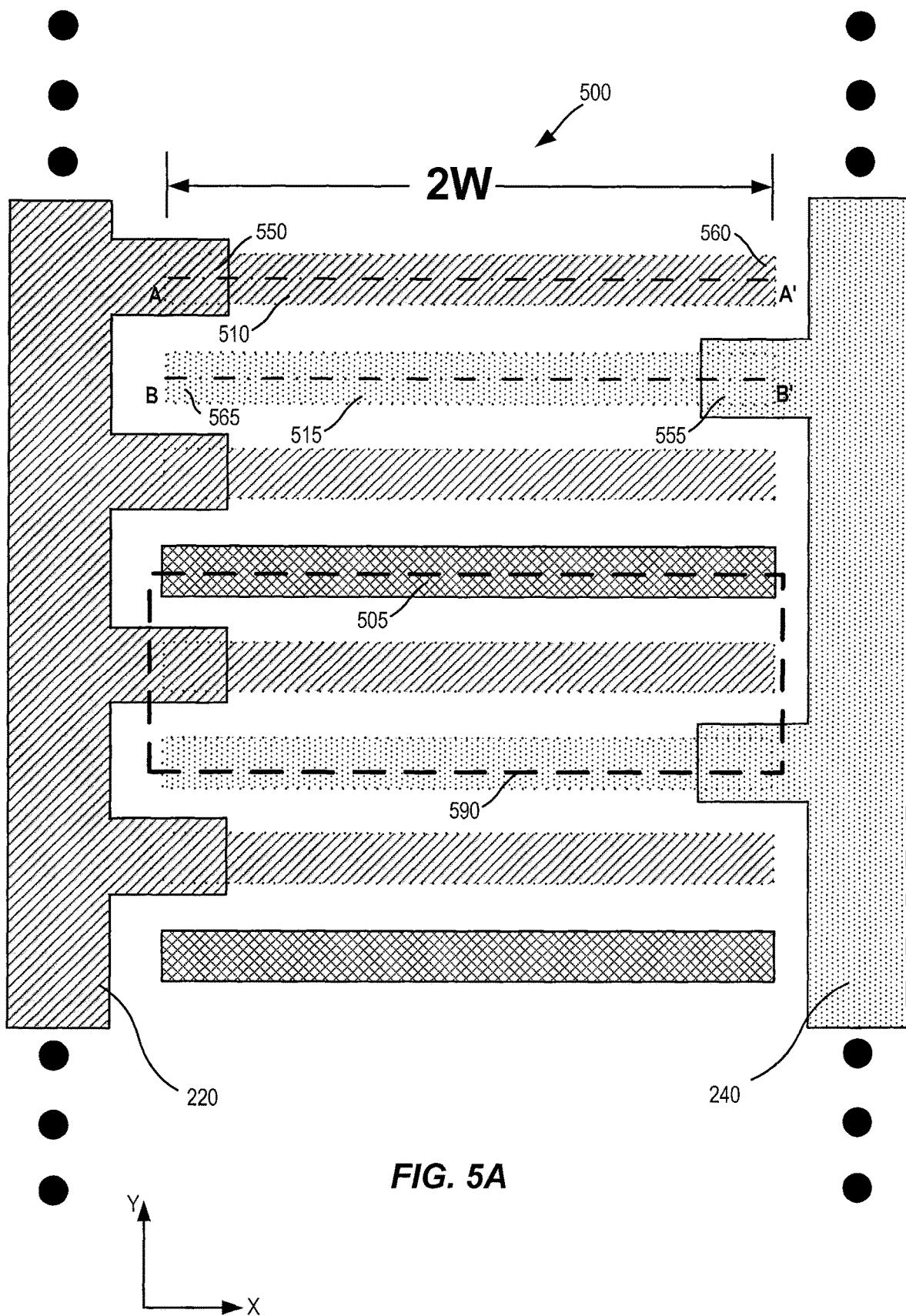
FIG. 5A is a plan view illustrating a transistor device in which a width of gate fingers is increased.
Figure 5B:
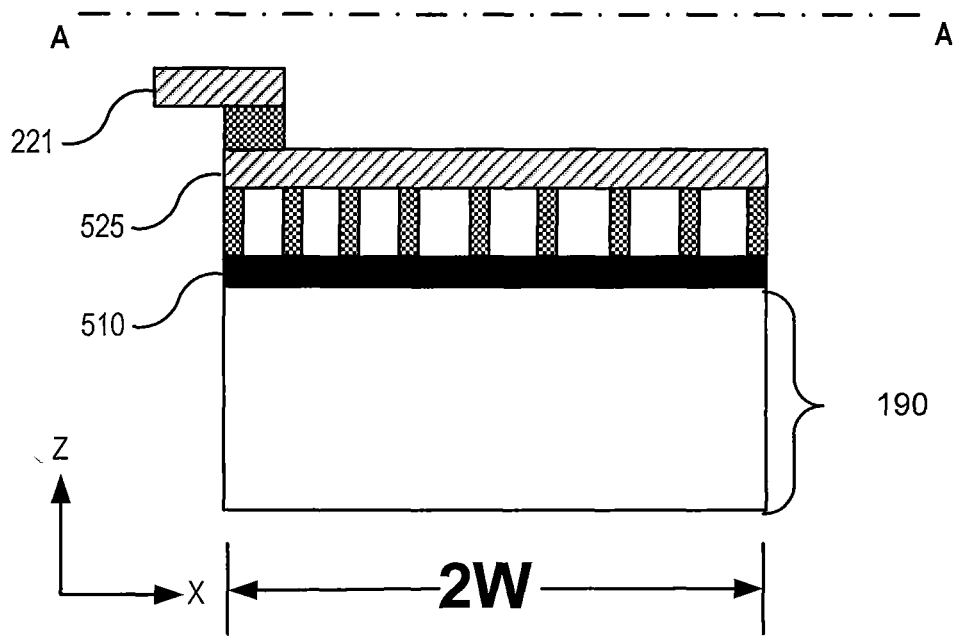
FIG. 5B is a cross section of FIG. 5A taken along the line A-A'.
Figure 5C:
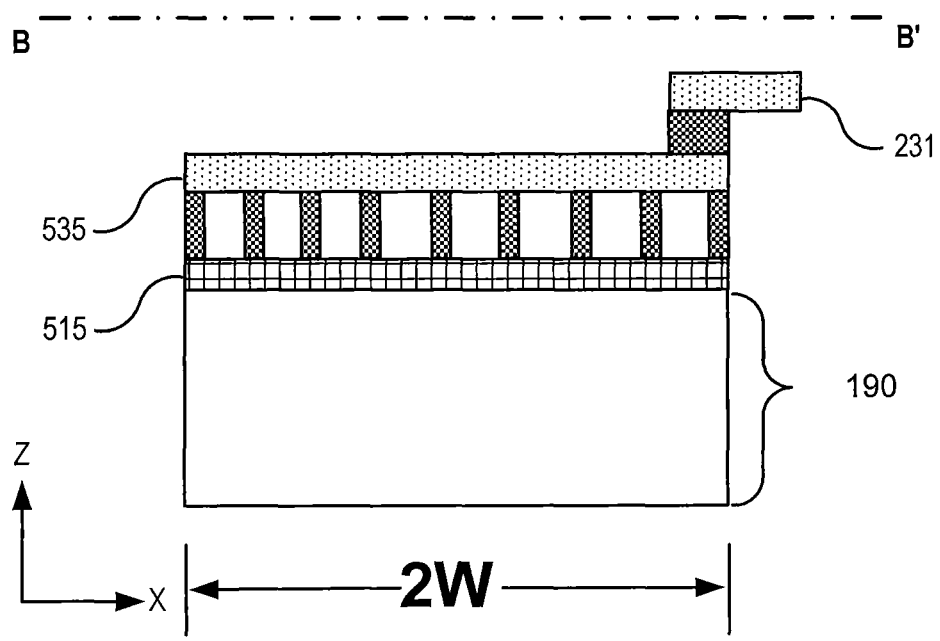
FIG. 5C is a cross section of FIG. 5A taken along the line B-B'.

In addition to increasing the number of gate fingers within the transistor device 100, another technique to increase the transistor output power may include increasing the gate finger width (W), along with corresponding increases in the widths of the source contacts and the drain fingers. FIG. 5A is a plan view illustrating an embodiment of a transistor device 500 in which the widths of the gate fingers 510, the source contacts 505 and the drain fingers 515 are increased. FIG. 5B is a cross section of FIG. 5A taken along the line A-A'. FIG. 5C is a cross section of FIG. 5A taken along the line B-B'.

The transistor device 500 of FIGS. 5A-5C may closely resemble the transistor device of FIGS. 2A-2C. However, the width of the gate fingers 510, the source contacts 505 and the drain fingers 515 included in the transistor device 500 is increased as compared to the widths of the corresponding gate fingers 210, source contacts 205 and drain fingers 215 of the transistor device 100. For example, a width of the gate fingers 510 of the transistor device 500 may be 2W (e.g., twice as wide as the gate width of the gate fingers 210 of transistor device 100). The gate fingers 510, source contacts, and drain fingers 515 with the increased width may be connected to the semiconductor structure 190 to form a transistor cell 590. The widened gate fingers 510 may include gate pads 221 and gate runners 525, with structure similar to that discussed herein with respect to the gate pads 221 and gate runners 225 of FIG. 2B. The widened drain fingers 515 may include drain pads 231 and drain runners 535, with structure similar to that discussed herein with respect to the drain pads 231 and drain runners 235 of FIG. 2C. Other aspects of the transistor device 500 may be similar to the transistor device 100 discussed above with respect to FIGS. 2A-2C. In addition, it will be appreciated that the transistor device 500 may include the semiconductor structure 190 that is may be configured as, for example, a HEMT or as other types of transistors such as, for example, LDMOS transistors in the same manner as the transistor device 100 as discussed above with reference to FIGS. 3A-3C.

Unfortunately, increasing the width of the gate fingers 510 may introduce performance issues. The first issue is an increase in gate resistance. (See, e.g., P. H. Aaen, J. A. Pla, J. Wood, "Modeling and Characterization of RF and Microwave Power FETs," Cambridge University Press, 2007). If the number of gate fingers 510 is held constant and the length of the gate fingers 510 is changed, the gate resistance for the new configuration of gate fingers 510 is given by:

$$R_{new} = R_{orig}\left(\frac{W_{new}}{W_{orig}}\right) \quad \text{[Equation 1]}$$

where $R_{orig}$ and $W_{orig}$ are the gate resistance and gate finger width, respectively, for the original gate finger configuration (e.g., gate finger 210 of FIG. 2A), and $W_{new}$ is the width of a gate finger in the new configuration (e.g., gate finger 510 of FIG. 5A). As can be seen from Equation 1, increasing the gate finger width from W to 2W doubles the gate resistance. Increasing the gate resistance may result in a lower transistor gain, an important specification for an amplifier. For example, if a transistor with a gate finger length of W produces an output power of P, doubling the width of the gate fingers 510 to 2W produces an output power that is lower than 2P. This non-linear scaling also poses a challenge for power amplifier designers in selecting the correct transistor die size for a given output power requirement. The increased resistance also reduces the efficiency of the amplifier.

Another drawback associated with gate fingers 510 and/or drain fingers 515 having large widths is the increase in a phase difference that occurs in the signal along the length of the finger (e.g., from region 550 to region 560 of the gate finger 510 and/or from region 555 to region 565 of the drain finger 515). This phase difference may be caused by various distributed effects related to the transmission distance along the gate finger 510 and/or the drain finger 515. These phase differences can degrade the total output current magnitude after being summed up (combined) at the drain manifold 240. The end result may be a lower output power for the transistor device 500 than expected from the increased dimensions. Since the input power is the same, this may also contribute to the gain degradation phenomenon.

Additionally, the out-of-phase current combining may affect the time-domain output current waveform shape, and may impact the transistor efficiency, which is another key specification for a power amplifier. (See, e.g., S. C. Cripps, "RF Power Amplifiers for Wireless Communications," Artech House, 2006.) The non-uniform phase phenomenon may also be present in the original shorter gate fingers 210 of FIGS. 2A-2C, but to a smaller degree.

Figure 6A:
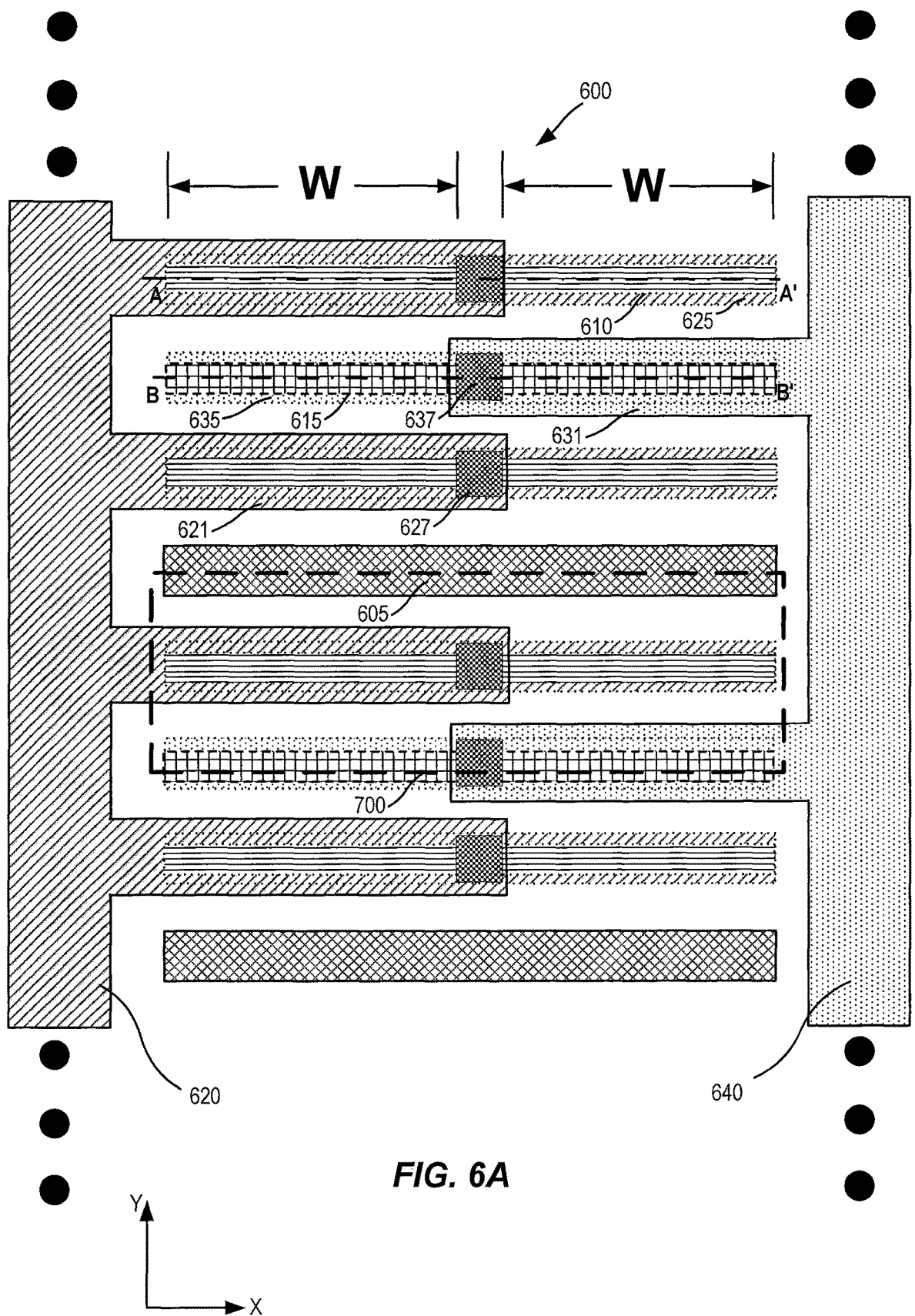
FIG. 6A is a plan view illustrating a transistor device in which a width of gate fingers is increased, according to some embodiments of the invention.
Figure 6B:
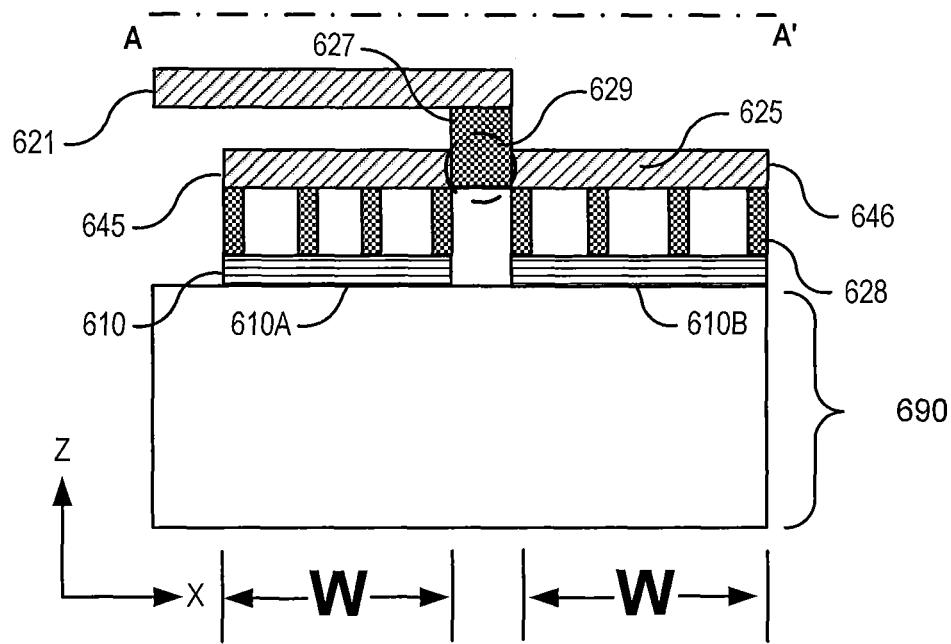
FIG. 6B is a cross section of FIG. 6A taken along the line A-A', according to some embodiments of the invention.
Figure 6C:
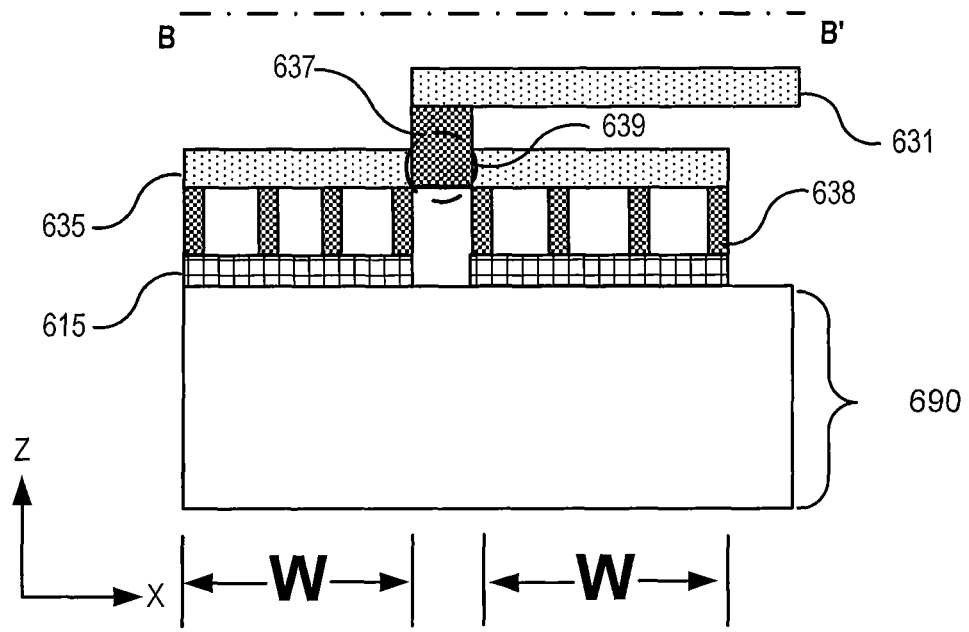
FIG. 6C is a cross section of FIG. 6A taken along the line B-B', according to some embodiments of the invention.

To mitigate these issues when higher output power is required, a solution is proposed as shown in FIGS. 6A, 6B, and 6C. FIG. 6A is a plan view illustrating a transistor device 600 in which the width of gate fingers 610 are increased, according to some embodiments of the invention. FIG. 6B is a cross section of FIG. 6A taken along the line A-A', according to some embodiments of the invention. FIG. 6C is a cross section of FIG. 6A taken along the line B-B', according to some embodiments of the invention.

As illustrated in FIGS. 6A, 6B, and 6C some embodiments of the present invention may provide a plurality of transistor cells 700 repeatedly arranged on a semiconductor structure 690. It will be appreciated that the transistor cells 700 may be formed of semiconductor structures 690 such as those illustrated in FIGS. 3A-3C (e.g., LDMOS or HEMT transistor cells). The transistors cells 700 may be arranged as part of a transistor device 600 to provide a combined output signal. For example, the respective gate regions, drain regions, and source regions of the plurality of transistor cells 700 may be commonly connected so as to provide a plurality of transistors coupled in parallel.

The transistor cells 700 may be repeatedly arranged in a first direction (e.g., a Y-direction). The gate region, the drain region, and the source region of a respective transistor cell 700 may extend in a second direction (e.g., an X-direction) that crosses the first direction. The active region for each of the transistor cells 700 may include the region of the semiconductor structure 690 in which a respective gate region, drain region, and source region overlap in the first direction (e.g., the X-direction). In some embodiments, the source region of adjacent transistor cells 700 may be a shared source region that acts as a source region for two different gate regions. Similarly, in some embodiments, the drain region of adjacent transistor cells 700 may be a shared drain region that acts as a drain region for two different gate regions.

The transistor device 600 may also include a plurality of gate fingers 610 that are spaced apart from each other along on the semiconductor structure 690 in the first direction (e.g., the Y-direction). Each of the gate fingers 610 may have a width 2W in the second direction (e.g., the X-direction) or some other width that exceeds the width of a conventional transistor device. In some embodiments the width 2W may be 800 microns.

The gate fingers 610 may be disposed on the semiconductor structure 690 to be respectfully in electrical contact with the gate regions (e.g., a channel) of the plurality of transistor cells 700. The plurality of gate fingers 610 may provide a gate signal to respective ones of the transistor cells 700.

In some embodiments, the transistor device 600 may also include a plurality of drain fingers 615 that are arranged on the semiconductor structure 690 in the first direction (e.g., the Y-direction). Each of the plurality of drain fingers 615 may have a width 2W in the second direction (e.g., the X-direction), though the present invention is not limited thereto. The plurality of drain fingers 615 may be disposed on the semiconductor structure 690 to be respectfully in electrical contact with the drain regions of the plurality of transistor cells 700. The drain fingers 615 may conduct a drain signal of respective ones of the transistor cells 700.

In some embodiments, the transistor device 600 may also electrically connect each of the source regions of respective ones of the transistor cells 700 to a common source signal. In some embodiments, the electrical connection for the source regions may be on a back side of the semiconductor structure 690 (e.g., a side of the semiconductor structure 690 that is opposite the gate fingers 610 and the drain fingers 615. In some embodiments, a plurality of source fingers 605 may also be provided on the same side of the semiconductor structure 690 as the gate fingers 610 and the drain fingers 615. The plurality of source fingers 605 may have a structure similar to that discussed herein with respect to the gate fingers 610 and drain fingers 615.

Each gate finger 610 may be coupled to a gate interconnect 625 by a plurality of first conductive gate vias 628. In some embodiments, the gate interconnects 625 may be at a higher level above the semiconductor structure 690 (e.g., in the Z-direction) than the gate fingers 610. In some embodiments, the gate interconnect 625 may have a greater dimension in the first direction (e.g., in the Y-direction) than the gate finger 610. The gate interconnects 625 may be connected to a gate runner 621 by a second conductive gate via 627. In some embodiments, the gate runner 621 may be at a higher level above the semiconductor structure 690 than the gate interconnect 625. In some embodiments, the gate runner 621 may have a greater dimension in the first direction (e.g., in the Y-direction) than the gate interconnects 625. In some embodiments, the gate runner 621 may contain metal or other highly conductive material, including, for example, copper, gold, and/or a composite metal. The gate runner 621 may be further connected to a gate manifold 620. The gate manifold 620 may provide the gate signal to the plurality of transistor cells 700.

In some embodiments, each second conductive gate via 627 that connects a gate runner 621 to a respective gate interconnect 625 may be connected to the gate interconnect 625 at an interior position 629 of the gate interconnect 625. For example, the gate interconnect 625 may have a first and second opposed ends 645, 646. In some embodiments, the second conductive gate via 627 may be connected to the gate interconnect 625 at an interior position 629 of the gate interconnect 625 that is between the first end 645 and the second end 646. In some embodiments, the interior position 629 may be at a midpoint of (e.g., halfway between) the first end 645 and the second end 646 of the gate interconnect 625. In some embodiments, the interior position 629 may be at a distance that is within ten percent of the length of the gate interconnect 625 from the midpoint of the gate interconnect 625. In some embodiments, the interior position 629 may be at a distance that is within twenty percent of the length of the gate interconnect 625 from the midpoint of the gate interconnect 625. In some embodiments, the interior position 629 may be at a distance that is between one-third and two-thirds of the distance between the first end 645 and the second end 646 of the gate interconnect 625.

Figure 7:
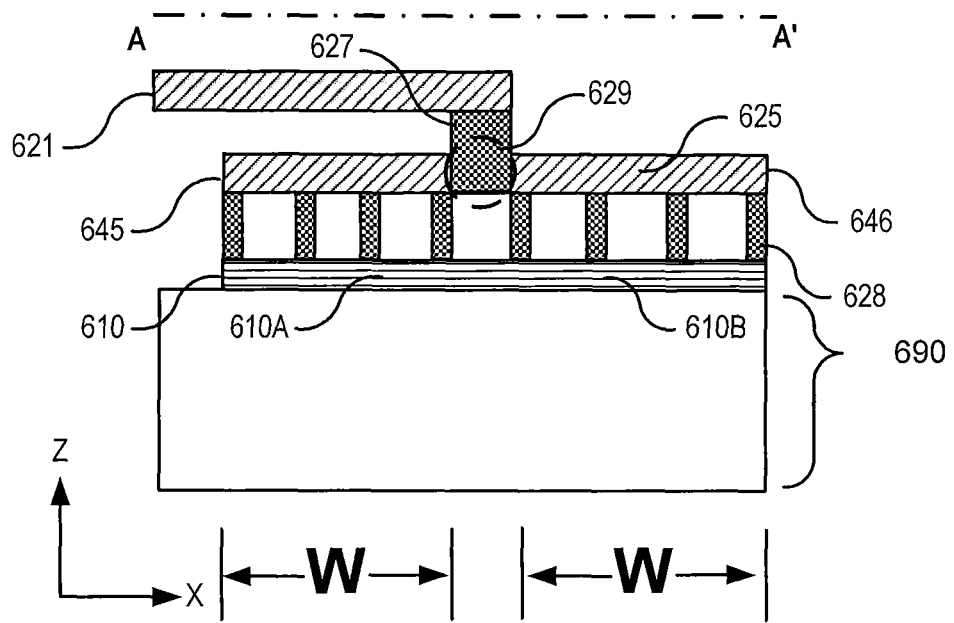
FIGS. 7 and 8 illustrate additional embodiments of the invention, taken along the line A-A' of FIG. 6A.

In some embodiments, each of the gate fingers 610 may be composed of a first segment 610A and a second segment 610B. In some embodiments, the first segment 610A and the second segment 610B may extend collinearly. In some embodiments, the first segment 610A and the second segment 610B may be arranged at opposite sides of the second conductive gate via 627. For example, for a gate finger 610 that has a width 2W, both the first segment 610A and the second segment 610B may have a width W, though the present invention is not limited thereto. In some embodiments, the first segment 610A and the second segment 610B may be physically separated by a gap, as illustrated in FIG. 6B. For example, there may an additional element (e.g., an insulation layer) disposed between the first segment 610A and the second segment 610B. However, the present invention is not limited thereto, and it will be appreciated that in other embodiments the gate finger 610 may not be divided into separate first and second segments 610A, 610B. For example, FIG. 7 illustrates an embodiment in which the first segment 610A and second segment 610B are integrally connected.

Figure 8:
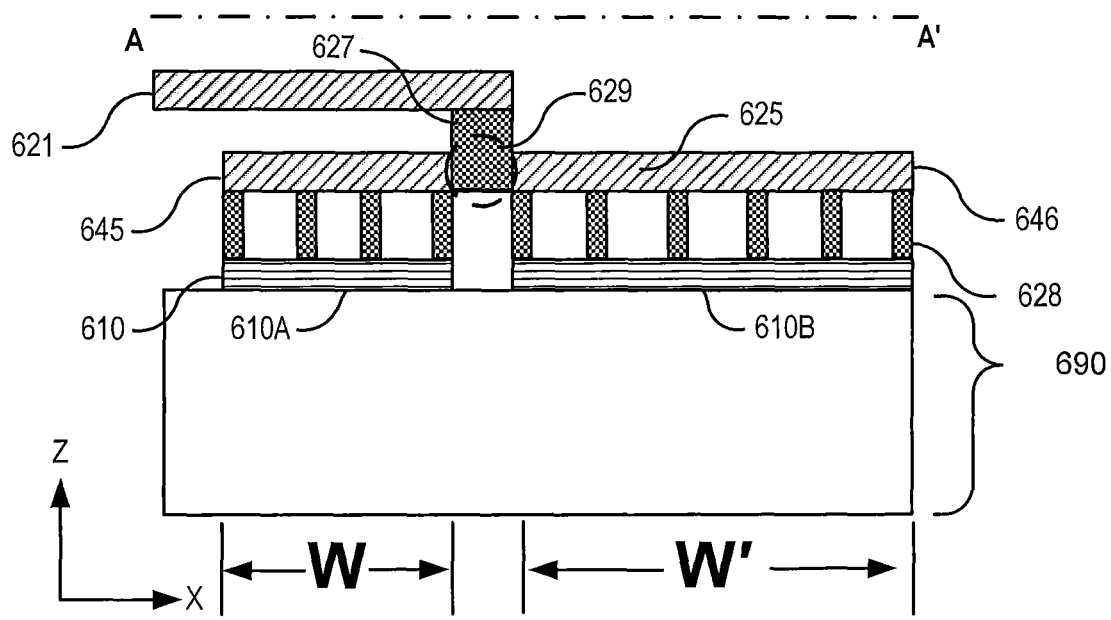

As noted above, in some embodiments, the second conductive gate via 627 may be located at an interior position 629 that is located at the midpoint of the gate interconnect 625. However, in some embodiments, the second conductive gate via 627 may be located at an interior position 629 that is offset from the midpoint of the gate interconnect 625. In such embodiments, the first segment 610A may have a different length than the second segment 610B (or vice versa). For example, as illustrated in FIG. 8, the first segment 610A may have a first length W, and the second segment 610B may have a second length W', different from the first length W.

Each drain finger 615 may be coupled to a respective drain interconnect 635 by a plurality of first conductive drain vias 638. In some embodiments, the drain interconnects 635 may be at a higher level above the semiconductor structure 690 than the drain fingers 615. In some embodiments, the drain interconnects 635 may be at a same level above the semiconductor structure 690 as the gate interconnects 625. In some embodiments, the drain interconnects 635 may be at a different level above the semiconductor structure 690 as the gate interconnects 625. In some embodiments, the drain interconnects 635 may have a greater dimension in the first direction (e.g., in the Y-direction) than the drain fingers 615.

Each drain interconnect 635 may be connected to a respective drain runner 631 by a respective second conductive drain via 637. In some embodiments, the drain runner 631 may be at a higher level above the semiconductor structure 690 than the drain interconnect 635. In some embodiments, the drain runner 631 may be at a same level above the semiconductor structure 690 as the gate runner 621. In some embodiments, the drain runner 631 may be at a different level above the semiconductor structure 690 as the gate runner 621. In some embodiments, the drain runners 631 may have a greater dimension in the first direction (e.g., in the Y-direction) than the drain interconnects 635. In some embodiments, the drain runners 631 may contain metal or other highly conductive material, including, for example, copper, gold, and/or a composite metal. The drain runners 631 may be connected to a drain manifold 640. The drain manifold 640 may provide the drain signal to the plurality of transistor cells 700.

As with the gate runners 621, in some embodiments, the second conductive drain vias 637 that connect each drain runner 631 to a respective drain interconnect 635 may be connected to the drain interconnect 635 at an interior position 639 of the drain interconnect 635. The various possibilities for connecting the drain runners 631 to the drain interconnects 635 are similar to those discussed herein with respect to connecting the gate runners 621 to the gate interconnects 625, and duplicate descriptions thereof will be not be repeated for brevity.

The solution described herein may split each gate interconnect 625 into two segments, and the feed from the gate runners 621 to the respective gate interconnects 625 may be provided through a second conductive gate via 627 located at, for example, roughly the center (e.g., a central portion) of each gate interconnect 625, providing a symmetric feed to the first segment 610A and the second segment 610B of the gate finger 610. A similar configuration may also be implemented for the drain side (e.g., for drain interconnect 635 and drain runner 631). This approach retains the original short gate and drain finger lengths (e.g., separate segments with individual lengths of W) while achieving the desired higher output power. In some embodiments, the use of the gate runners 621, which may be wider and have a lower resistance than the gate interconnects 625, may not significantly increase the gate resistance, and may advantageously reduce phase differences in the combined signals of the transistor cells 700 that can degrade the output power of the transistor device 600. For example, in embodiments of the present invention, when a signal (e.g., current) is transmitted over the second conductive gate via 627 to a gate interconnect 625, the signal received at the first end 645 of the gate interconnect 625 may have less than 1 degree phase difference from the signal received at the second end 646 of the gate interconnect 625. In some embodiments, the phase difference may be less than 0.5 degrees.

The present invention increases the finger lengths of a transistor device in a parallel configuration instead of in a series configuration, as is used in conventional devices. However, the present invention reaches substantially the same or greater total gate periphery as the conventional devices. The embodiments described herein therefore produce the desired higher output power but retain the original shorter individual gate finger length of the conventional devices.

With this technique, the gate resistance of the gate finger (or the drain resistance of the drain finger) adds in parallel instead of in series, reducing the overall resistance and improving the transistor gain in a high-power configuration.

This technique has a similar effect as doubling the number of gate fingers but does not result in a die dimension that is physically too wide to fit in a package. It also mitigates the phase variation issues associated with wide transistor dies discussed herein with respect to FIG. 4.

This embodiments described herein also reduce the phase variation along the increased gate and drain finger lengths (2W) described with respect to FIGS. 5A-5C, reverting back to the original phase delta of the shorter gate length (W) described with respect to FIGS. 2A-2C, but increasing (e.g., doubling) the output current.

Figure 9:
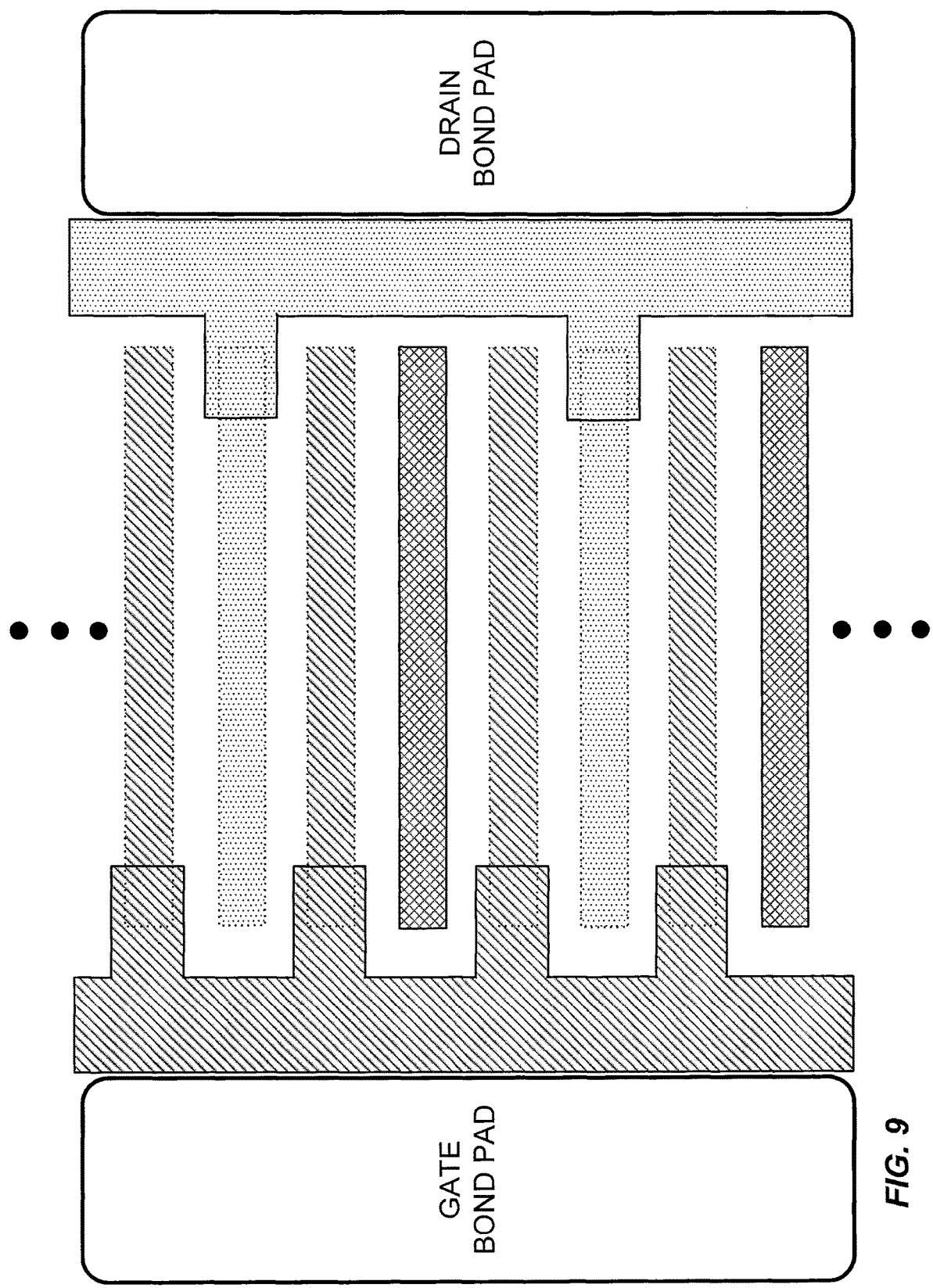
FIGS. 9 and 10 illustrate a comparison of a conventional gate finger configuration with a gate finger configuration according to embodiments of the invention.
Figure 10:
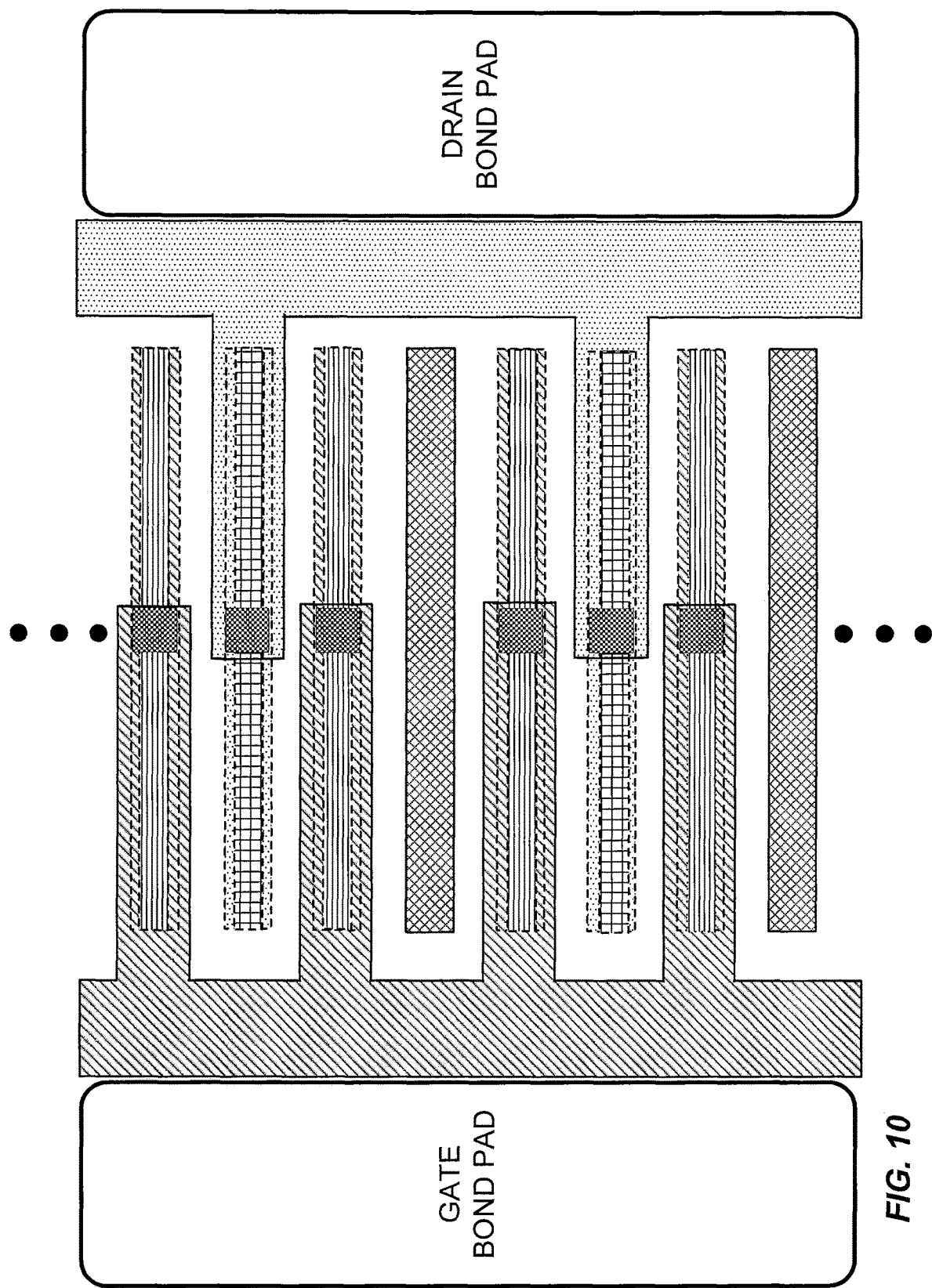

FIGS. 9 and 10 are plan views of a conventional transistor device and a transistor device according to embodiments of the present invention, respectively. The embodiment of the present invention, illustrated in FIG. 10, may be use the same gate and drain bond pad configuration as an existing die, as illustrated in FIG. 9, enabling the standard wire bonding process in manufacturing. For example, as compared to the conventional transistor device having a gate finger width of W, the embodiments of the present invention may maintain the same overall transistor dimension in the first direction (e.g., the Y-direction) while, for example, doubling the gate finger width to 2W in the second direction (e.g., the X-direction). Thus, a transistor device according to the embodiments of the present invention may allow the same or substantially similar manufacturing process to be used as for the conventional transistor device.

As can be seen in FIG. 10, utilizing the gate/drain runner and gate/drain interconnect configuration described herein may improve the performance of the existing device by reducing a phase displacement of the signals propagating through the device. In some embodiments, the improved configuration illustrated in FIG. 10 may be integrated with an existing die while minimizing modifications to the manufacturing process.

Figure 11:
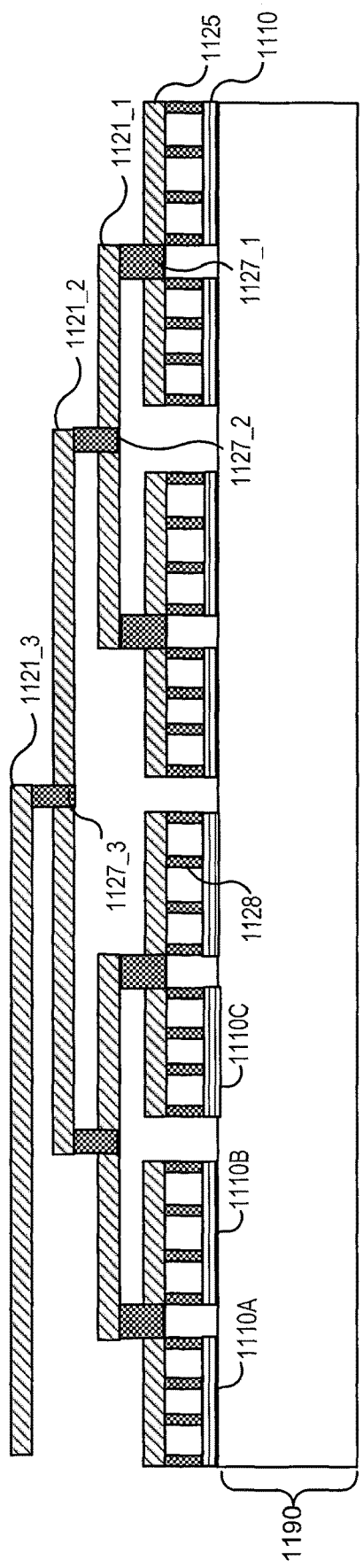
FIG. 11 is a cross section illustrating a transistor device in which multiple gate runners are utilized, according to some embodiments of the invention.

FIG. 11 is a cross section illustrating a transistor device in which multiple gate runners are utilized, according to some embodiments of the invention. In some embodiments, additional conductor layers (e.g., gate runners) may be used in a branch-out form as shown in FIG. 11. In some embodiments, the branch-out may be symmetric. The number of conductor layers can be expanded to allow for more branches, enabling shorter fingers to be used while producing the same desired gate periphery. For example, as illustrated in FIG. 11, a gate finger 1110 may be separated into a number of gate finger segments 1110A, 1110B, 1110C, etc. As discussed herein with respect to FIGS. 6B and 7, the gate finger segments 1110A, 1110B, 1110C may be separated from one another or may be integrated.

The gate finger 1110 may be further coupled to a gate interconnect 1125 by a plurality of first conductive gate vias 1128. In some embodiments, gate interconnect 1125 may be at a higher level than the gate finger 1110. In some embodiments, the gate interconnect 1125 may have a greater dimension in the first direction (e.g., in the Y-direction) than the gate finger 1110. The gate finger 1110 may be connected to a semiconductor structure 1190 in a manner similar to the semiconductor structure 690 of FIGS. 6A-C.

The gate interconnect 1125 may be further connected to a first gate runner 1121_1 by a plurality of second conductive gate vias 1127_1. The first gate runner 1121_1 may be at a higher level than the gate interconnect 1125. In some embodiments, the gate runner 1121_1 may have a greater dimension in the first direction (e.g., in the Y-direction) than the gate interconnect 1125. In some embodiments, the gate interconnect 1125 may be in segments. For example, the gate interconnect 1125 may be separated into a plurality (e.g., 4) segments that may be physically isolated from one another. Each of the segments of the gate interconnect 1125 may be connected to the first gate runner 1121_1 by one of the plurality of second conductive gate vias 1127_1 that is placed at an interior position of the segment of the gate interconnect 1125. In some embodiments, the interior position of the segment of the gate interconnect 1125 may be a midpoint of the segment of the gate interconnect 1125.

The first gate runner 1121_1 may be further connected to a second gate runner 1121_2 by a plurality of third conductive gate vias 1127_2. The second gate runner 1121_2 may be at a higher level than the first gate runner 1121_1. In some embodiments, the second gate runner 1121_2 may have a greater dimension in the first direction (e.g., in the Y-direction) than the first gate runner 1121_1. The second gate runner 1121_2 may be further connected to a third gate runner 1121_3 by a fourth conductive gate via 1127_3. The third gate runner 1121_3 may be at a higher level than the second gate runner 1121_2. In some embodiments, the third gate runner 1121_3 may have a greater dimension in the first direction (e.g., in the Y-direction) than the second gate runner 1121_2. In this way, a device with three layers of gate runners 1121_1, 1121_2, 1121_3 may be constructed.

In some embodiments, each gate runner layer may be connected to an adjacent lower layer below it by a conductive via positioned at an interior position of the adjacent lower layer. For example, the third gate runner 1121_3 may be connected to the second gate runner 1121_2 by the fourth conductive gate via 1127_3 that is placed at an interior position of the second gate runner 1121_2. In some embodiments, the interior position may be a midpoint of the second gate runner 1121_2. In some embodiments, the interior position may be at a distance that is within ten percent of the length of the gate runner layer from the midpoint of the gate runner layer. In some embodiments, the interior position may be at a distance that is within twenty percent of the length of the gate runner layer from the midpoint of the gate runner layer. In some embodiments, the interior position may be at a distance that is between one-third and two-thirds of the distance between a first end and a second end of the gate runner layer.

As illustrated in FIG. 11, some of the stacked gate runner layers may be in segments. For example, the first gate runner 1121_1 may be separated into two segments that may be physically isolated from one another. Each of the segments of the first gate runner 1121_1 may be connected to the second gate runner 1121_2 by one of the plurality of third conductive gate vias 1127_2 that is placed at an interior position of the segment. In some embodiments, the interior position of the segment of the first gate runner 1121_1 is a midpoint of the segment. In some embodiments, the first gate runner 1121_1 may be a unitary layer. In addition, though FIG. 11 illustrates three gate runners 1121_1, 1121_2, and 1121_3 it will be understood that more or fewer gate runners and/or layers may be provided without exceeding the scope of the invention.

The invention described herein is technology independent, which means it can be applied for LDMOS, GaN, and other high-power RF transistor technologies. While embodiments of the present invention are illustrated with reference to a LDMOS and HEMT structures, the present inventive concepts are not limited to such devices. Thus, embodiments of the present invention may include other transistor devices having a plurality of unit cells and a controlling electrode. Embodiments of the present invention may be suitable for use in any transistor device where a wider controlling electrode is desired and multiple unit cells of the device are present. Thus, for example, embodiments of the present invention may be suitable for use in various types of devices, such as, MESFETs, MMICs, SITs, LDMOS, BJTs, pHEMTs, etc., fabricated using SiC, GaN, GaAs, silicon, etc.

Figure 12A:
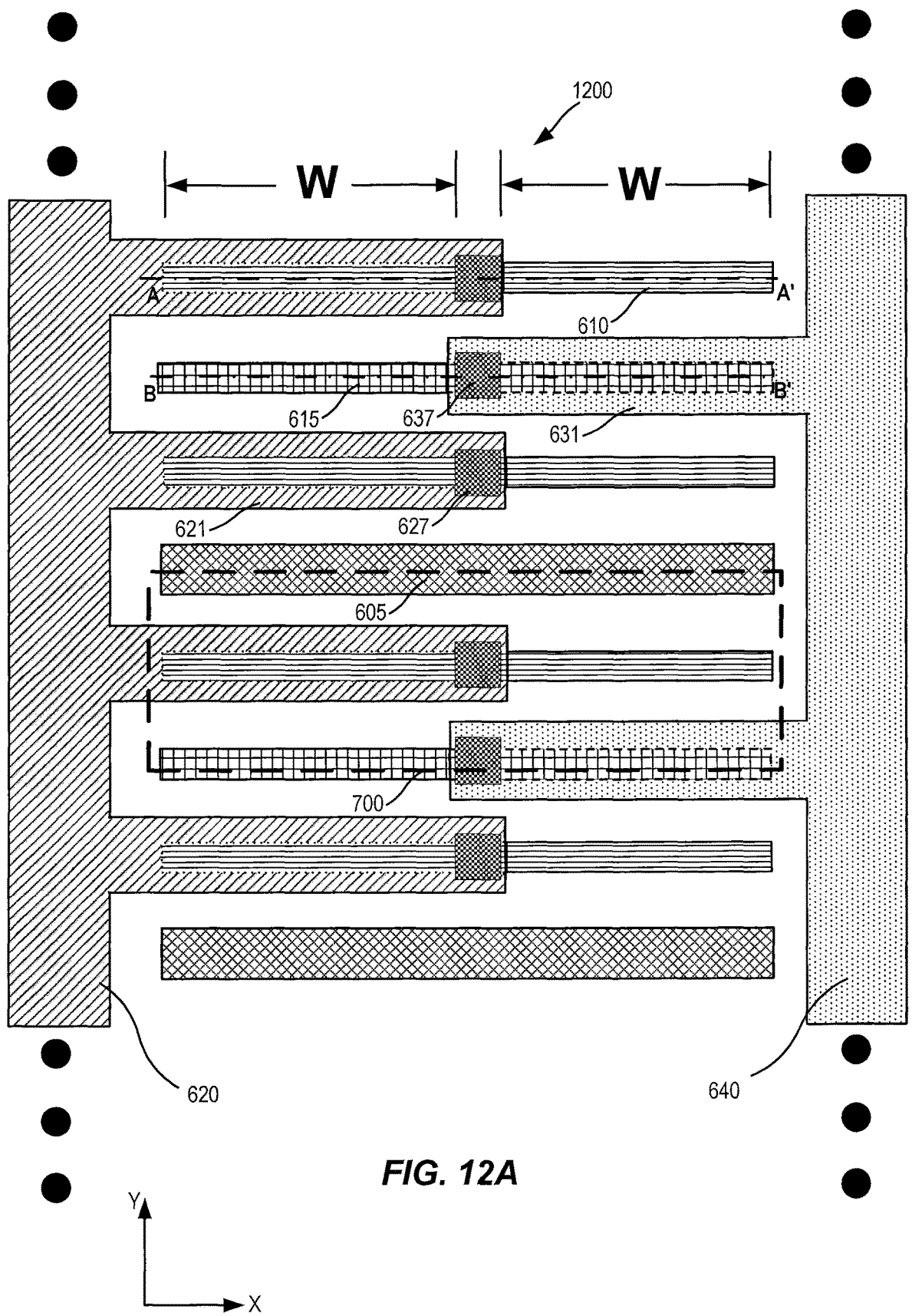
FIG. 12A is a plan view illustrating a transistor device in which the gate and drain fingers are fed at interior locations without an intervening interconnect.
Figure 12B:
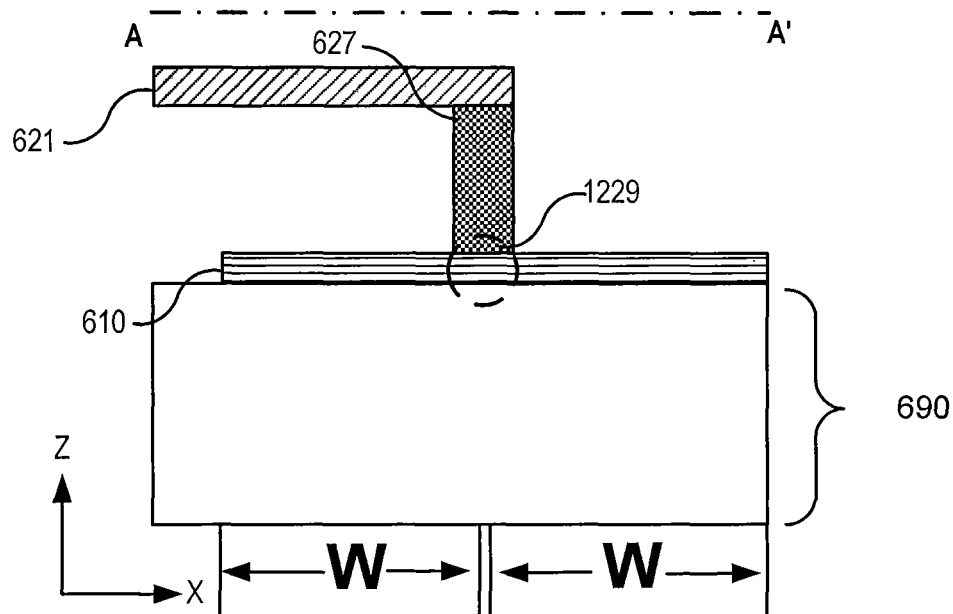
FIG. 12B is a cross section of FIG. 12A taken along the line A-A', according to some embodiments of the invention.
Figure 12C:
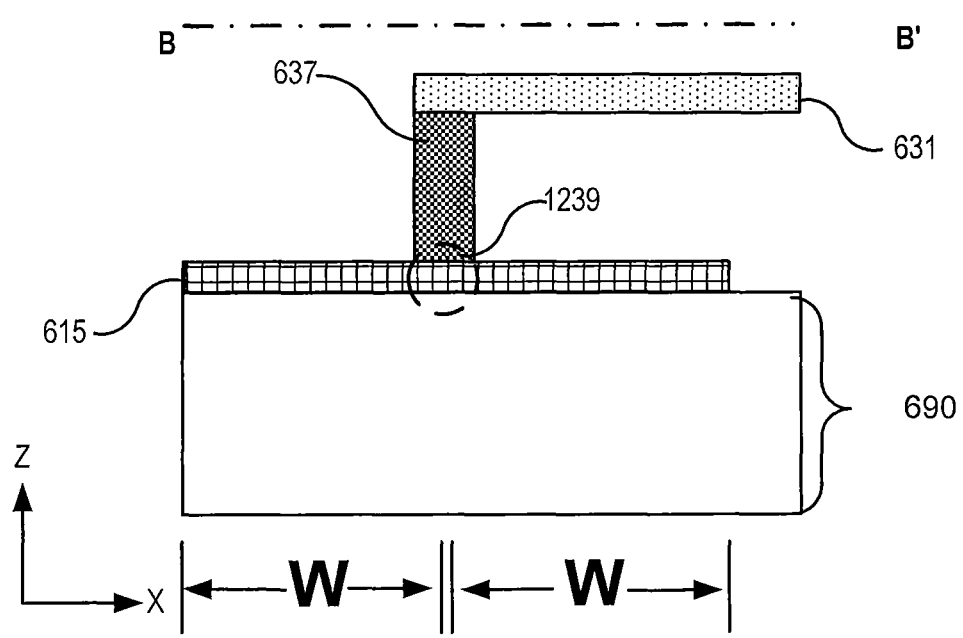
FIG. 12C is a cross section of FIG. 12A taken along the line B-B', according to some embodiments of the invention.

Though the embodiments described herein have incorporated a gate interconnect (see, e.g., gate interconnect 625 in FIG. 6B and drain interconnect 635 in FIG. 6C), it will be understood that, in some embodiments, the drain/gate runner may connect directly to the drain/gate finger at an interior location. FIG. 12A is a plan view illustrating a transistor device 1200 in which the gate and drain fingers are fed at interior locations without an intervening interconnect. FIG. 12B is a cross section of FIG. 12A taken along the line A-A', according to some embodiments of the invention. FIG. 12C is a cross section of FIG. 12A taken along the line B-B', according to some embodiments of the invention. Elements of FIGS. 12A-12C which are similar to those previously described are denoted with similar reference numbers, and duplicate descriptions thereof may be omitted.

As illustrated in FIGS. 12A-12C, a gate runner 621 may be connected to the gate finger 610 and/or a drain runner 631 may be connected to the drain finger 615 at an interior location without an intervening interconnect structure. For example, referring to FIG. 12B, the gate runner 621 may extend over the gate finger 610 to connect to an interior position 1229 of the gate finger 610 via a conductive via 627. In some embodiments, the interior position 1229 may be at a midpoint of the gate finger 610. In some embodiments, the interior position 1229 may be at a distance that is within ten percent of the length of the gate finger 610 from the midpoint of the gate finger 610. In some embodiments, the interior position 1229 may be at a distance that is within twenty percent of the length of the gate finger 610 from the midpoint of the gate finger 610. In some embodiments, the interior position 1229 may be at a distance that is between one-third and two-thirds of the distance between opposite ends of the gate finger 610.

In a similar manner, as illustrated in FIG. 12C, the drain runner 631 may extend over the drain finger 615 to connect to an interior position 1239 of the drain finger 615 via a conductive via 637. In some embodiments, the interior position 1239 may be at a midpoint of the drain finger 615. In some embodiments, the interior position 1239 may be at a distance that is within ten percent of the length of the drain finger 615 from the midpoint of the drain finger 615. In some embodiments, the interior position 1239 may be at a distance that is within twenty percent of the length of the drain finger 615 from the midpoint of the drain finger 615. In some embodiments, the interior position 1239 may be at a distance that is between one-third and two-thirds of the distance between opposite ends of the drain finger 615.

Though FIG. 12A illustrates that both the drain finger 615 and the gate finger 610 are directly connected to the drain runner 631 and gate runner 621, respectively, without a respective interconnect, it will be understood that other configurations are possible. For example, in some embodiments, the gate runner 621 may be connected to the gate finger 610 through an interior position 629 of the gate interconnect 625 as illustrated, for example, in FIG. 6B, while the drain runner 631 may be connected to the drain finger 615 at an interior position 1239 without a drain interconnect as illustrated, for example, in FIG. 12C. In some embodiments, the drain runner 631 may be connected to the drain finger 615 through an interior position 639 of the drain interconnect 635 as illustrated, for example, in FIG. 6C, while the gate runner 621 may be connected to the gate finger 610 at an interior position 1229 without a gate interconnect as illustrated, for example, in FIG. 12B.

The use of an interconnect (e.g., a gate interconnect and/or a drain interconnect) may allow for the use of a layer having a lower resistance than the intrinsic finger of the transistor device (e.g., a gate finger and/or a drain finger). For example, the interconnect may, in some embodiments, be formed of a metal layer and/or may have larger dimensions than the finger. In some embodiments, the finger may be made of polysilicon. In some technologies, the additional metal layers for use as an interconnect may not be available. In some embodiments, the additional metal layers may be used when additional space is available. For example, as discussed herein, source regions of the device may be electrically connected through a back surface of the device, rather than a top surface. In such embodiments, wiring layers to the gate finger of the device can extend over the surface of the source region without interfering with connections to the source region.

Figure 13A:
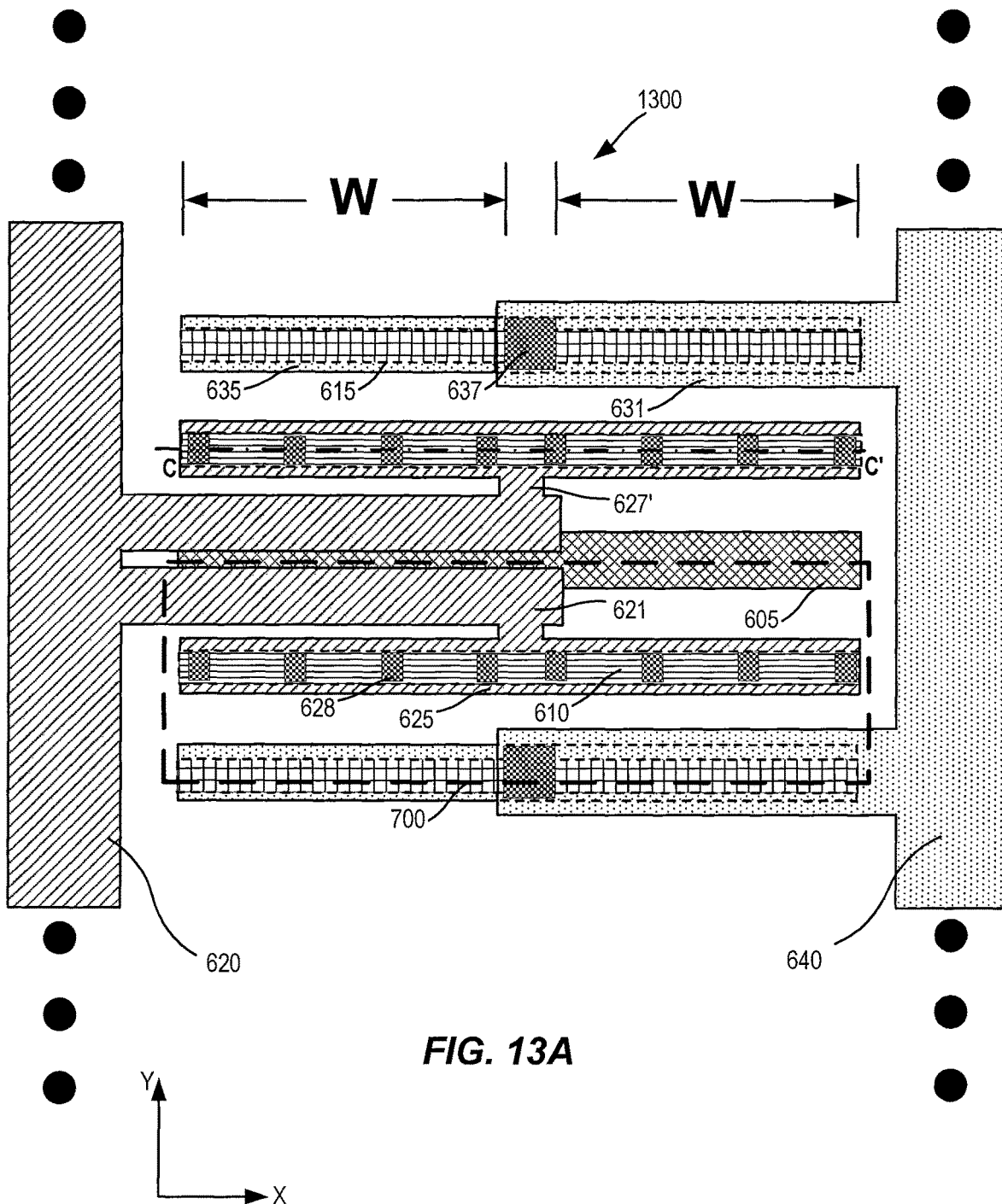
FIG. 13A is a plan view illustrating a transistor device in which the gate runner extends over a source region.
Figure 13B:
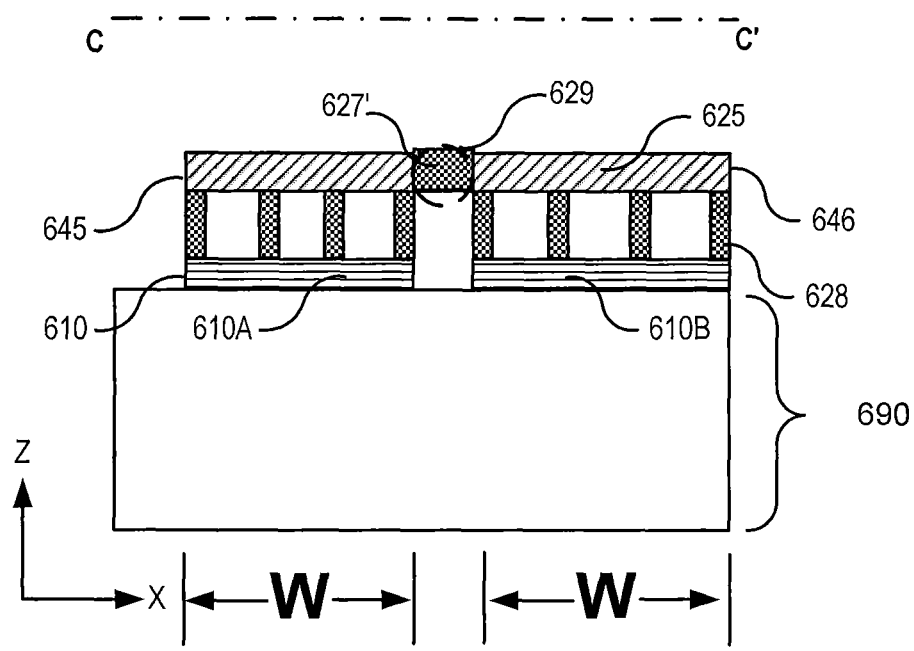
FIG. 13B is a cross section of FIG. 13A taken along the line C-C', according to some embodiments of the invention.
Figure 13C:
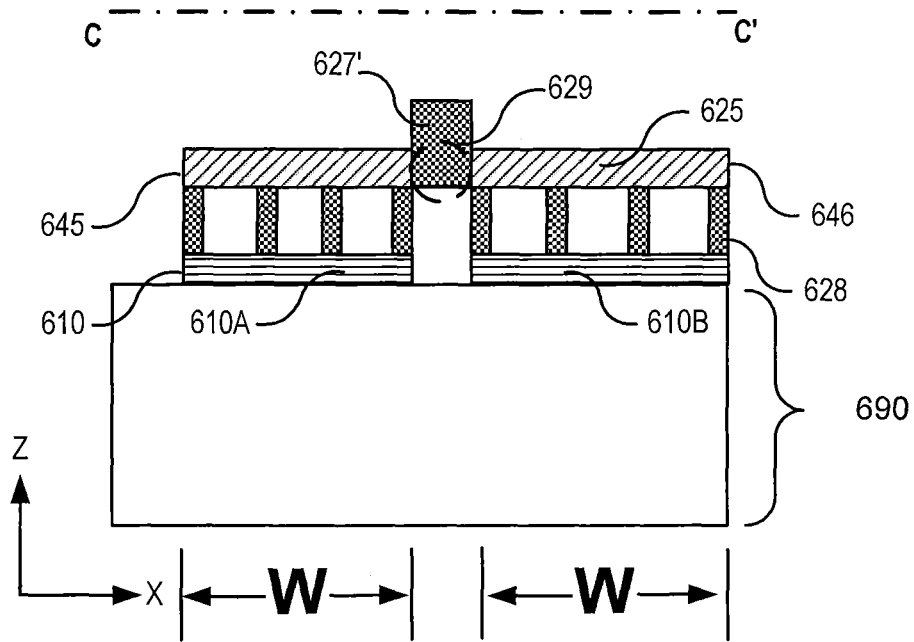
FIG. 13C is also a cross section of FIG. 13A taken along the line C-C', according to an additional embodiment of the invention.

FIG. 13A is a plan view illustrating a transistor device 1300 in which the gate runner 621 extends over a source region 605. FIG. 13B is a cross section of FIG. 13A taken along the line C-C', according to some embodiments of the invention. FIG. 13C is also a cross section of FIG. 13A taken along the line C-C', according to an additional embodiment of the invention. Elements of FIGS. 13A-13C which are similar to those previously described are denoted with similar reference numbers, and duplicate descriptions thereof may be omitted.

As illustrated in FIG. 13A, in some embodiments, portions of the gate runner 621 and/or the gate interconnect 625 may extend over a source region 605 of the transistor device 1300. Portions of the gate runner 621 and/or the gate interconnect 625 may be offset (e.g., in the Y direction) from the gate finger 610. For example, as illustrated in FIGS. 13A and 13B, the gate runner 621 may extend over the source region 605 adjacent the gate finger 610. The gate runner 621 may connect to the gate interconnect 625 at an interior position 629 of the gate interconnect 625. The interior position 629 may be between a first end 645 and a second end 646 of the gate interconnect 625. In some embodiments, the interior position 629 may be at a midpoint of the gate finger 610. In some embodiments, the interior position 629 may be at a distance that is within ten percent of the length of the gate finger 610 from the midpoint of the gate finger 610. In some embodiments, the interior position 629 may be at a distance that is within twenty percent of the length of the gate finger 610 from the midpoint of the gate finger 610. In some embodiments, the interior position 629 may be at a distance that is between one-third and two-thirds of the distance between opposite ends of the gate finger 610. The gate interconnect 625 may be coupled to the gate finger 610 (e.g., first and second segments 610A, 610B) by a plurality of conductive vias 628.

The gate runner 621 may be connected to the gate interconnect 625 by a conductive portion 627'. In some embodiments, the conductive portion 627' may extend in a direction parallel to a surface of the semiconductor structure 690 (e.g., a Y direction) between the gate runner 621 and the gate interconnect 625. In some embodiments, the conductive portion 627' may be composed of a same or similar material as the gate runner 621.

The gate runner 621 may be disposed at a same level as the gate interconnect 625, as illustrated in FIG. 13B, but the embodiments described herein are not limited thereto. For example, as illustrated in FIG. 13C, the gate runner 621 may be disposed at a different level than the gate interconnect 625. In such embodiments, the conductive portion 627' may also extend in direction perpendicular to the top surface of the semiconductor structure 690 (e.g., the Z direction).

As discussed herein, in some embodiments, the interconnects (e.g., the drain interconnect and/or the gate interconnect) may be connected to the intrinsic fingers of the transistor device through a plurality of conductive vias (e.g., conductive vias 628 of FIG. 6B and/or conductive vias 638 of FIG. 6C). In some embodiments, it may be beneficial to have a configuration of conductive vias to the gate finger that is different from a configuration of conductive vias to the drain finger.

For example, when reviewed in plan view, such as in FIG. 6A, it can be seen that a gate signal applied to a gate runner 621 will be communicated to the gate interconnect 625 at an interior position of the gate interconnect 625. As illustrated in FIGS. 6A-6C, he signal will then electrically flow from the interior position of the gate finger 610 to the exterior/edge of the gate finger 610 by way of the conductive vias 628. Thus, the gate signal is applied to the semiconductor structure 690 from an interior position to the edge.

On the drain side of the transistor cell, electrical signals/current received at the interior portion of the drain finger 615 have the shortest distance to travel to the drain runner 631 to be output by the device, while the electrical signals/current received at the edge portions of the drain finger 615 have the longest distance to travel to the drain runner 631 to be output by the device. When viewed as a complete transistor cell, a bias applied to the outermost edge of the gate finger 610, which travels the farthest along the gate path, may induce a signal on the drain finger 615 that also has the farthest to travel along the drain path. As recognized by the inventors, this variation can cause issues with current summation in the device.

Figure 14A:
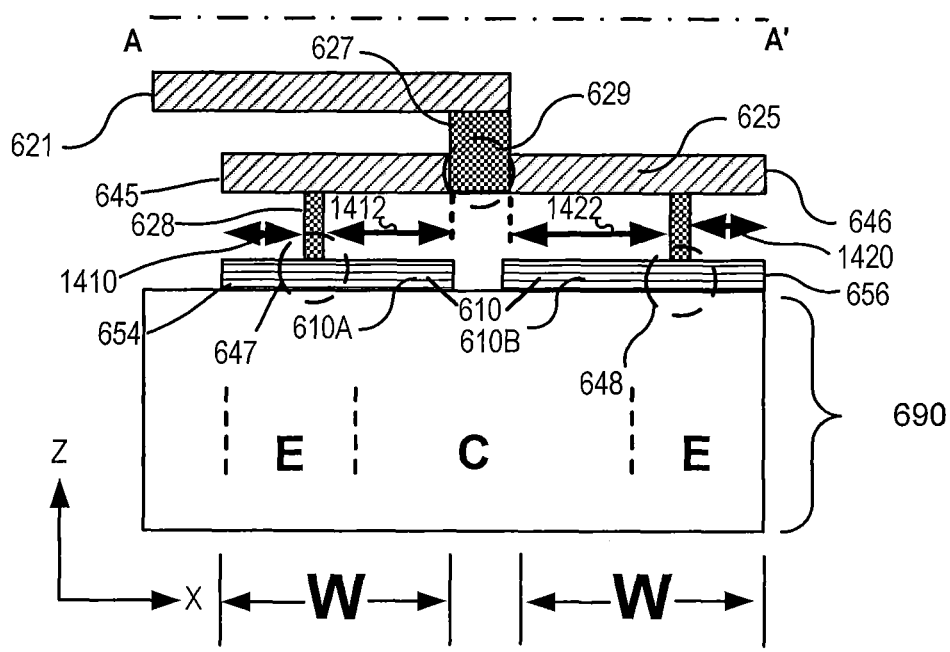
FIG. 14A is a cross section of FIG. 6A taken along the line A-A', illustrating an additional configuration of conductive vias according to some embodiments of the invention.
Figure 14B:
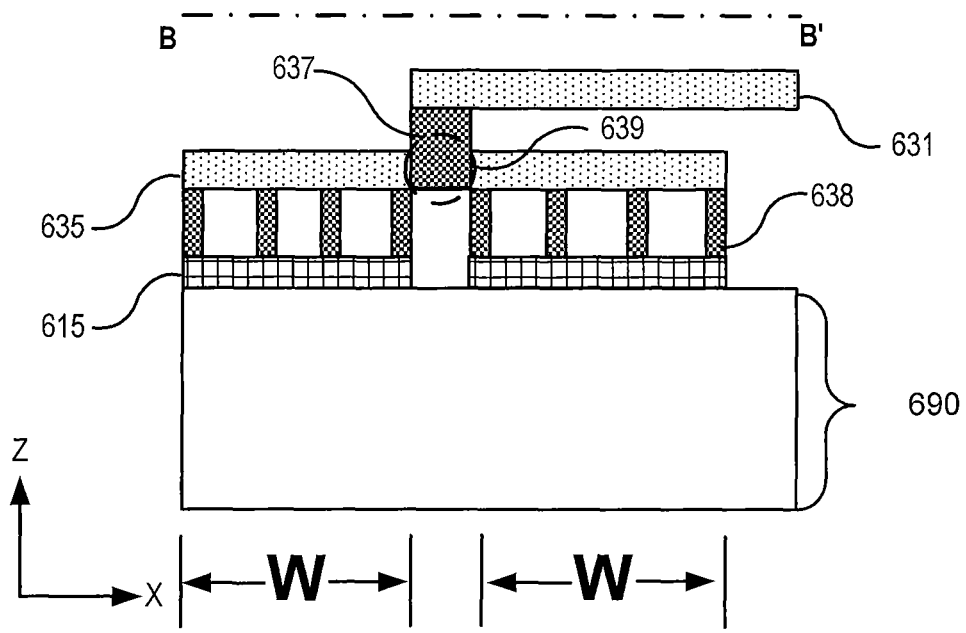
FIG. 14B is a cross section of FIG. 6A taken along the line B-B', according to some embodiments of the invention.

FIG. 14A is a cross section, taken along the line A-A' of FIG. 6A, illustrating an embodiment of the present invention in which an interior fed gate interconnect 625 is coupled to the gate finger 610 at positions that are adjacent edges of the gate finger 610. FIG. 14B is a cross section, taken along the line B-B' of FIG. 6A, illustrating an embodiment of the present invention in which an interior fed drain interconnect 635 is coupled to the drain finger 615 via a plurality of conductive vias 638. Elements of FIGS. 14A and 14B which are similar to those previously described are denoted with similar reference numbers, and duplicate descriptions thereof may be omitted.

In accordance with an aspect of the present invention, the gate signal is fed to an interior position 629 of the gate interconnect 625, and the gate interconnect 625 is coupled to a gate finger 610 at a position 647, 648 by an offset (e.g., offset 1412 and/or offset 1422) from the interior position 629. In some embodiments, an interior fed gate interconnect 625 is coupled to the gate finger 610 at a position adjacent an edge of the gate finger 610. In some embodiments, the gate interconnect/finger configuration described relative to FIG. 14A can be used together with the drain interconnect/finger configuration of FIG. 15B, described further herein. In some embodiments, other gate and/or drain interconnect/finger configurations are possible, such as configurations described in any of the other figures. For example, the gate configuration of FIG. 14A can also be used within or with a configuration as described in FIG. 11.

As illustrated in FIG. 14A, a gate runner 621 may be coupled to a gate finger 610 is a way similar to that previously described. For example, each gate finger 610 may be coupled to a gate interconnect 625 by a plurality of first conductive gate vias 628. In some embodiments, the gate interconnects 625 may be at a higher level above the semiconductor structure 690 (e.g., in the Z-direction) than the gate fingers 610. In some embodiments, the gate interconnect 625 may have a greater dimension in the first direction (e.g., in the Y-direction) than the gate finger 610. The gate interconnects 625 may be connected to a gate runner 621 by a second conductive gate via 627 at an interior position 629 of the gate interconnect 625. In some embodiments, the gate runner 621 may be at a higher level above the semiconductor structure 690 than the gate interconnect 625. In some embodiments, the interior position 629 may be at a midpoint of (e.g., halfway between) the first end 645 and the second end 646 of the gate interconnect 625. In some embodiments, the interior position 629 may be at a distance that is within ten percent of the length of the gate interconnect 625 from the midpoint of the gate interconnect 625. In some embodiments, the interior position 629 may be at a distance that is within twenty percent of the length of the gate interconnect 625 from the midpoint of the gate interconnect 625. In some embodiments, the interior position 629 may be at a distance that is between one-third and two-thirds of the distance between the first end 645 and the second end 646 of the gate interconnect 625.

In some embodiments, the gate runner 621 may have a greater dimension in the first direction (e.g., in the Y-direction) than the gate interconnect 625. In some embodiments, the gate runner 621 may contain metal or other highly conductive material, including, for example, copper, gold, and/or a composite metal. The gate runner 621 may be further connected to a gate manifold 620. The gate manifold 620 may provide the gate signal to the plurality of transistor cells 700.

In some embodiments, the gate finger 610 may be composed of a first segment 610A and a second segment 610B with a gap therebetween, though the present invention is not limited thereto. For example, in some embodiments, the gate finger 610 may be a single segment. In some embodiments, the first segment 610A and the second segment 610B may be arranged collinearly. A length of the first segment 610A (e.g., in the X direction) may the same or different than a length of the second segment 610B. The gate finger 610 may have opposite edges 654 and 656. The first opposite edge 654 may be located at an edge of the gate finger 610 that is closest to the gate manifold 620 (see FIG. 6A). The second opposite edge 656 may be located at an edge of the gate finger 610 that is closest to the drain manifold 640 (see FIG. 6A). A first conductive via 628 between the gate interconnect 625 and the gate finger 610 may be connected to the gate finger 610 at a first position 647 offset from the first opposite edge 654 by a first offset 1410, and a second conductive via 628 between the gate interconnect 625 and the gate finger 610 may be connected to the gate finger 610 at second position 648 offset from the second opposite edge 656 of the gate finger 610 by a second offset 1420. In other words, the first position 647 may be adjacent the first opposite edge 654 and the second position 648 may be adjacent the second opposite edge 656.

The first offset 1410 and the second offset 1420 may be configured so as to position the first and/or second conductive via 628 adjacent the respective opposite edges 654, 656 of the gate finger 610. In some embodiments, the first and/or second conductive via 628 may be offset from respective opposite edges 654, 656 of the gate finger 610 by first and second offsets 1410, 1420 that are within one-third of the width of the gate finger (e.g., in the X direction) from the closest opposite edge 654, 656 of the gate finger 610. As used herein, the width of the gate finger 610 (e.g., a width of the gate for the associated transistor cell) is a distance between opposite edges 654, 656 of the gate finger 610 (e.g., in the X direction) that does not include the gap between the gate finger segments 610A, 610B. In some embodiments, the width of the gate finger 610 may be the sum of the width of the first gate finger segment 610A and the width of the second gate finger segment 610B. In some embodiments, the first and/or second conductive via 628 may be offset from respective opposite edges 654, 656 of the gate finger 610 by first and second offsets 1410, 1420 that are within one-fourth of the width of the gate finger 610 (e.g., in the X direction) from the closest opposite edge 654, 656 of the gate finger 610. It will be understood that the first offset 1410 and the second offset 1420 from the edges 654, 656 may have different values from one another (e.g., one of the offsets may be larger than the other). In some embodiments, the offsets 1412 and/or 1422 between the interior position 629 of the gate interconnect 625 and the position 647 and/or 648 of the gate finger 610 may be greater than the first and/or second offset 1410, 1420 between the conductive via 628 and the edges 654, 656 of the gate finger 610, respectively.

In some embodiments, the gate finger 610 may be divided into edge portions E where the first and/or second conductive via 628 may be connected to the gate finger 610 with a central portion C therebetween. For example, a first conductive via 628 may be connected at a first position 647 and a second conductive via 628 may be connected at a second position 648. The first position 647 of the first conductive via 628 may be offset by a first offset 1412 from the interior position of the gate interconnect 625 and the second position 648 of the second conductive via 628 may be offset by a second offset 1422 from the interior position of the gate interconnect 625.

In some embodiments, the first position 647 may be located within the first segment 610A of the gate finger 610 that is within a half of the first segment 610A that is closest to the gate manifold 620 (see FIG. 6A). In some embodiments, the second position 648 may be located within the second segment 610B of the gate finger 610 that is within a half of the second segment 610B that is closest to the drain manifold 640 (see FIG. 6A).

In some embodiments, the first offset 1410 from the edge 654 and/or the second offset 1420 from the edge 656 may be substantially zero, though the present invention is not limited thereto. In other words, the first and/or second conductive via 628 may be located at or near the respective opposite edges 654, 656 of the gate finger 610. This embodiment is illustrated in FIG. 14C.

Figure 14C:
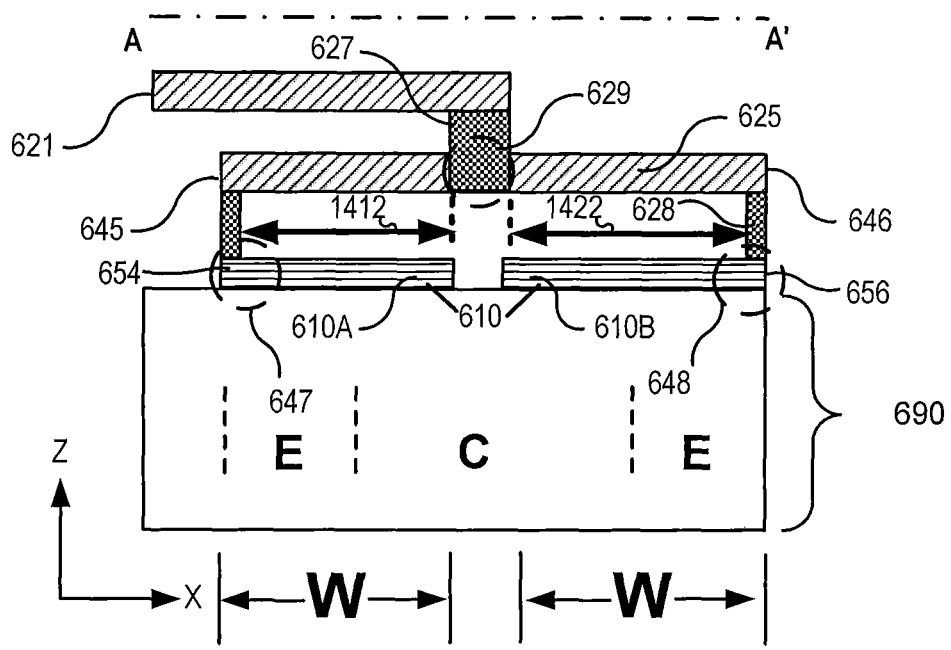
FIGS. 14C and 14D illustrate additional examples of the embodiments of FIG. 14A.
Figure 14D:
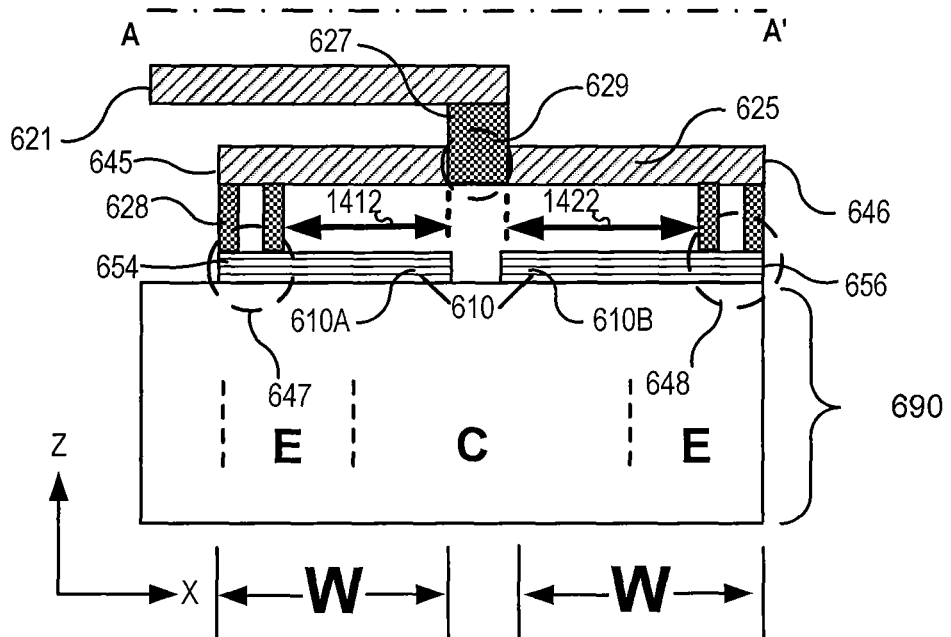

Though FIGS. 14A and 14C have illustrated embodiments in which each opposite edge 654, 656 of the gate finger 610 has a single conductive via 628 that is offset from the respective edge, it will be understood that the present invention is not limited thereto. In some embodiments, a plurality of conductive vias 628 may be located in an edge portion E of the gate finger 610 (e.g., offset from the edge of the gate finger 610). An example in which each of the gate finger segments 610A, 610B has a plurality of conductive vias 628 within the edge portion E of the respective gate finger segments 610A, 610B is illustrated in FIG. 14D.

In some embodiments, the sole connections between the gate interconnect 625 and the gate finger 610 may be within the edge portions E (e.g., offset from the opposite edges of the gate finger 610), e.g., at the first position 647 and the second position 648, such that a central portion (e.g., central portion C) is free of connections to the gate interconnect 625.

Referring now to FIG. 14B, it is illustrated that the drain finger 615 may have a different configuration of conductive vias 638 than the gate finger 610. While the gate interconnect 625 may be connected to the gate finger 610 at, or offset from, opposite edges 654, 656 of the gate finger 610, the drain interconnect 635 may be connected to the drain finger 615 across multiple locations of the drain finger 615. In other words, configuration of the drain finger may be as previously discussed with respect to FIG. 6C.

The different configurations of conductive vias between the drain finger 615 and the gate finger 610 may follow the energy propagation direction of the device 600 and allow for a transistor device 600 that operates more efficiently than conventional devices.

Figure 15A:
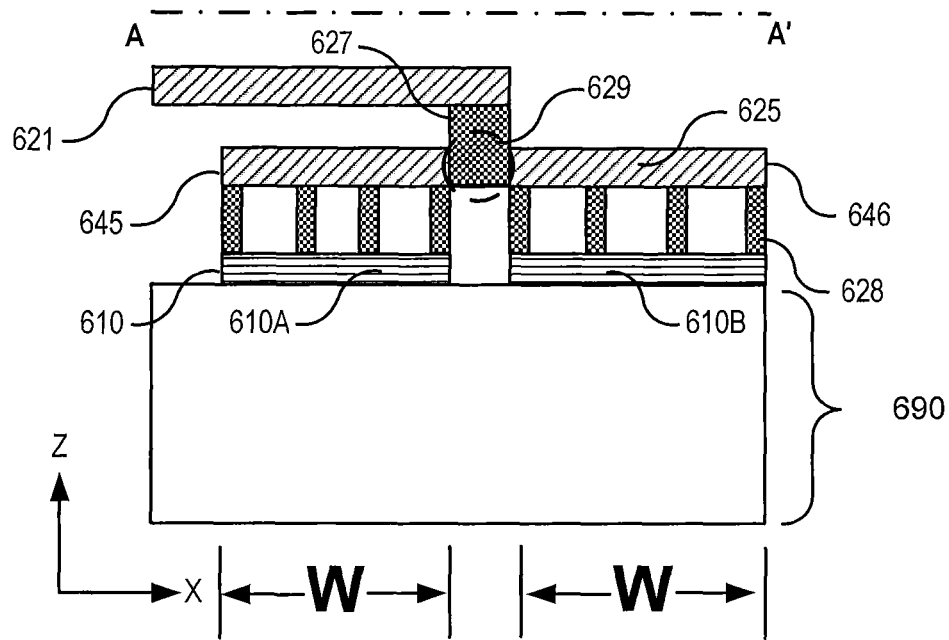
FIG. 15A is a cross section of FIG. 6A taken along the line A-A', illustrating an additional configuration of conductive vias according to some embodiments of the invention.
Figure 15B:
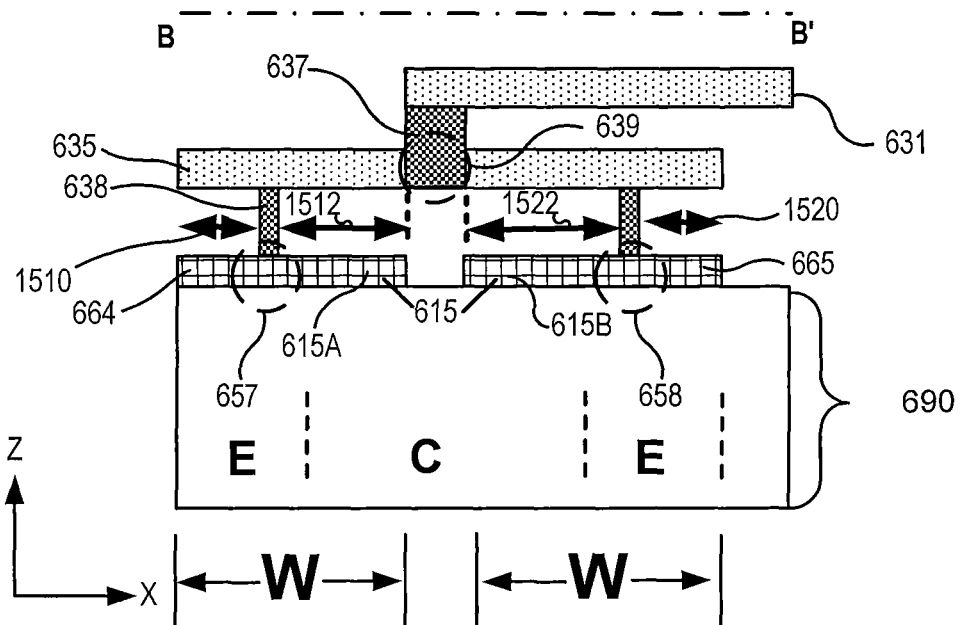
FIG. 15B is a cross section of FIG. 6A taken along the line B-B', according to some embodiments of the invention.

Though FIGS. 14A and 14B illustrate an embodiment in which the gate finger 610 is connected to the gate interconnect 625 at a position that is offset from opposite edges of the gate finger 610, and the drain finger 615 is connected to the drain interconnect 635 across the length of the drain finger 615, it will be understood that this configuration could be reversed as shown in FIGS. 15A and 15B.

In some embodiments, the drain finger 615 may be connected to the drain interconnect 635 at a position that is offset from opposite edges of the drain finger 615, and the gate finger 610 may be connected to the gate interconnect 625 across the length of the gate finger 610. This embodiment is illustrated in FIGS. 15A and 15B. FIG. 15A is a cross section, taken along the line A-A' of FIG. 6A, illustrating another embodiment of the present invention in which an interior fed gate interconnect 625 is coupled to the gate finger 610 by a plurality of conductive vias 628. In FIG. 15B, a cross section taken along the line B-B' of FIG. 6A, an interior fed drain interconnect 635 is coupled to the drain finger 615 at positions that are adjacent edges of the drain finger 615.

In accordance with an aspect of the present invention, FIG. 15B shows the drain signal is fed to an interior position 639 of the drain interconnect 635, and the drain interconnect 635 is coupled to at least one drain finger 615 at a first position 657 by an offset 1512 from the interior position 639 and at a second position 658 by an offset 1522 from the interior position 639. In some embodiments, an interior fed drain interconnect 635 is coupled to the drain finger 615 at a position adjacent an edge of a drain finger 615. In some embodiments, the drain interconnect/finger configuration can be used together with the gate interconnect/finger configuration of FIG. 15A. In some embodiments, other drain and/or gate interconnect/finger configurations are possible, such as configurations described in any of the other figures. The drain configuration of FIG. 15B can also be used within or with a configuration structured as FIG. 11.

Referring to FIG. 15B, the drain finger 615 may be composed of a first segment 615A and a second segment 615B with a gap therebetween, though the present invention is not limited thereto. For example, in some embodiments, the drain finger 615 may be a single segment. In some embodiments, the first segment 615A and the second segment 615B may be arranged collinearly. A length of the first segment 615A (e.g., in the X direction) may the same or different than a length of the second segment 615B. The drain finger 615 may have opposite edges 664 and 665. The first opposite edge 664 may be located at an edge of the drain finger 615 that is closest to the gate manifold 620 (see FIG. 6A). The second opposite edge 665 may be located at an edge of the drain finger 615 that is closest to the drain manifold 640 (see FIG. 6A). A second conductive via 638 between the drain interconnect 635 and the drain finger 615 may be connected to the drain finger 615 at a first position 657 offset from the first opposite edge 664 by a first offset 1510, and a second conductive via 638 between the drain interconnect 635 and the drain finger 615 may be connected to the drain finger 615 at second position 658 offset from the second opposite edge 665 of the drain finger 615 by a second offset 1520.

The first offset 1510 and the second offset 1520 may be configured so as to position the first and/or second conductive via 638 adjacent the respective opposite edges 664, 665 of the drain finger 615. In some embodiments the first and/or second conductive via 638 may be offset from respective opposite edges 664, 665 of the drain finger 615 by first and second offsets 1510, 1520 that are within one-third, or, in some embodiments, one-fourth, of the width of the drain finger 615 (e.g., in the X direction) from the closest opposite edge 664, 665 of the drain finger 615. As used herein, the width of the drain finger 615 is a distance between opposite edges 664, 665 of the drain finger 615 (e.g., in the X direction) that does not include the gap between the drain finger segments 615A, 615B. In some embodiments, the width of the drain finger 615 may be the sum of the width of the first drain finger segment 615A and the width of the second drain finger segment 615B. In some embodiments, the first and/or second conductive via 638 may be offset from respective opposite edges 664, 665 of the drain finger 615 by first and second offsets 1510, 1520 that are within one-fourth of the width of the drain finger 615 (e.g., in the X direction) from the closest opposite edge 664, 665 of the drain finger 615. It will be understood that the first offset 1510 and the second offset 1520 may have different values from one another (e.g., one of the offsets may be larger than the other). In some embodiments, the offsets 1512 and/or 1522 between the interior position 639 of the drain interconnect 635 and the position 657 and/or 658 of the drain finger 615 may be greater than the first and/or second offset 1510, 1520 between the conductive via 638 and the edges 664, 665 of the drain finger 615, respectively.

In some embodiments, the drain finger 615 may be divided into edge portions E where the first and/or second conductive via 638 may be connected to the drain finger 615 with a central portion C therebetween. In some embodiments, the first position 657 may be located within the first segment 615A of the drain finger 615 that is within a half of the first segment 615A that is closest to the gate manifold 620 (see FIG. 6A). In some embodiments, the second position 658 may be located within the second segment 615B of the drain finger 615 that is within a half of the second segment 615B that is closest to the drain manifold 640 (see FIG. 6A).

In some embodiments, the first offset 1510 and/or the second offset 1520 may be substantially zero, though the present invention is not limited thereto. In other words, the first and/or second conductive via 638 may be located at or near the respective opposite edges 664, 665 of the drain finger 615. This embodiment is illustrated in FIG. 15C.

Figure 15C:
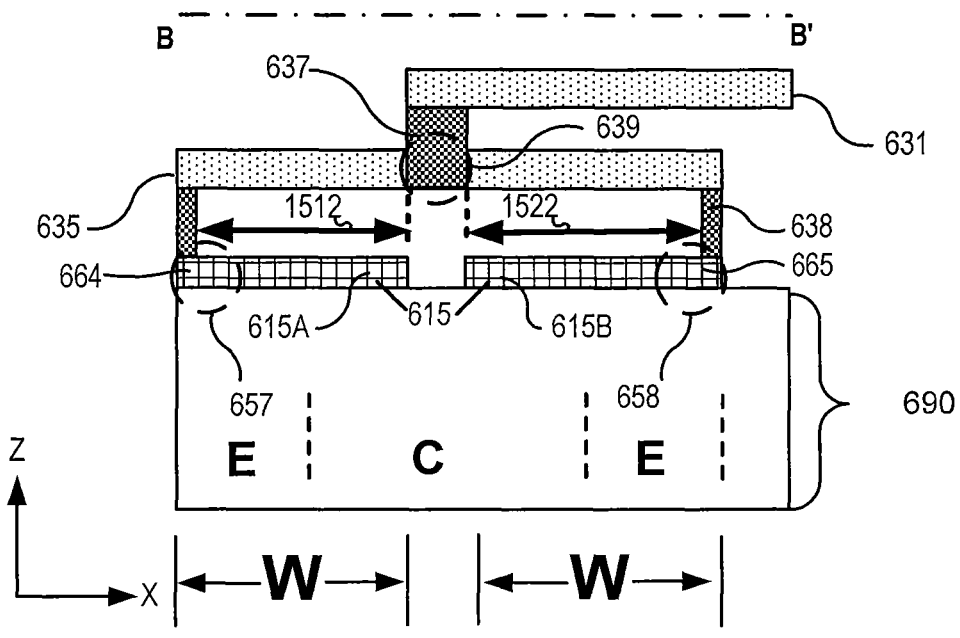
FIGS. 15C and 15D illustrate additional examples of the embodiments of FIG. 15A.
Figure 15D:
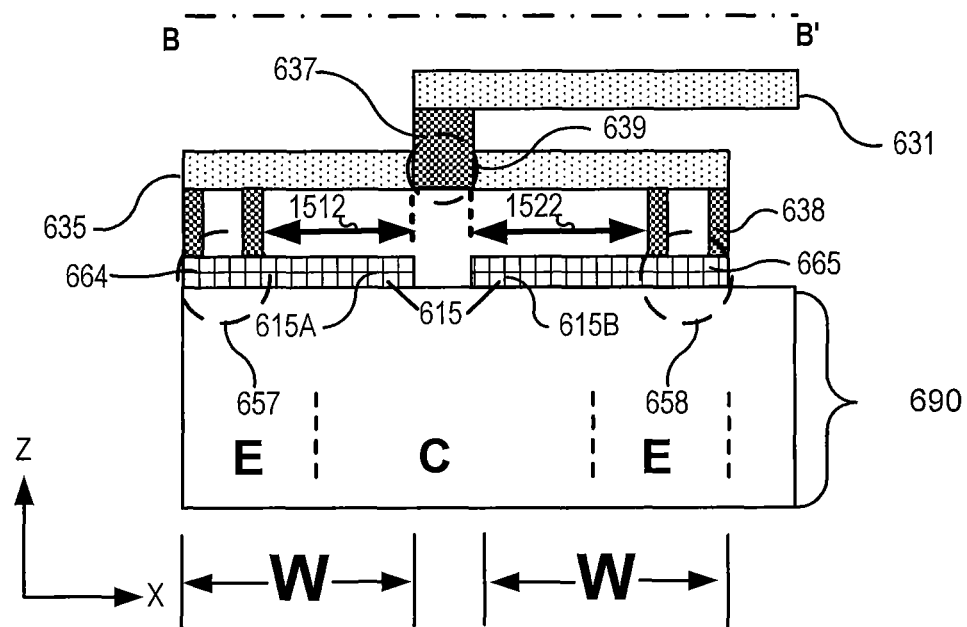

Though FIGS. 15A and 15C have illustrated embodiments in which each opposite edge 664, 665 of the drain finger 615 has a single conductive via 638 that is offset from the respective edge, it will be understood that the present invention is not limited thereto. In some embodiments, a plurality of conductive vias 638 may be located in an edge portion E of the drain finger 615 (e.g., offset from the edge of the drain finger 615). An example in which each of the drain finger segments 615A, 615B has a plurality of conductive vias 638 within the edge portion E of the respective drain finger segments 615A, 615B is illustrated in FIG. 15D.

In some embodiments, the sole connections between the drain interconnect 635 and the drain finger 615 may be within the edge portions E (e.g., offset from at the opposite edges of the drain finger 615, e.g., at the first position 657 and the second position 658, such that a central portion (e.g., central portion C) is free of connections to the drain interconnect 635.

Referring now to FIG. 15A, it is illustrated that the gate finger 610 may have a different configuration of conductive vias 628 than the drain finger 615. While the drain interconnect 635 may be connected to the drain finger 615 at, or offset from, opposite edges 664, 665 of the drain finger 615, the gate interconnect 625 may be connected to the gate finger 610 across multiple locations of the gate finger 610. In other words, configuration of the gate finger may be as previously discussed with respect to FIG. 6B.

Figure 16A:
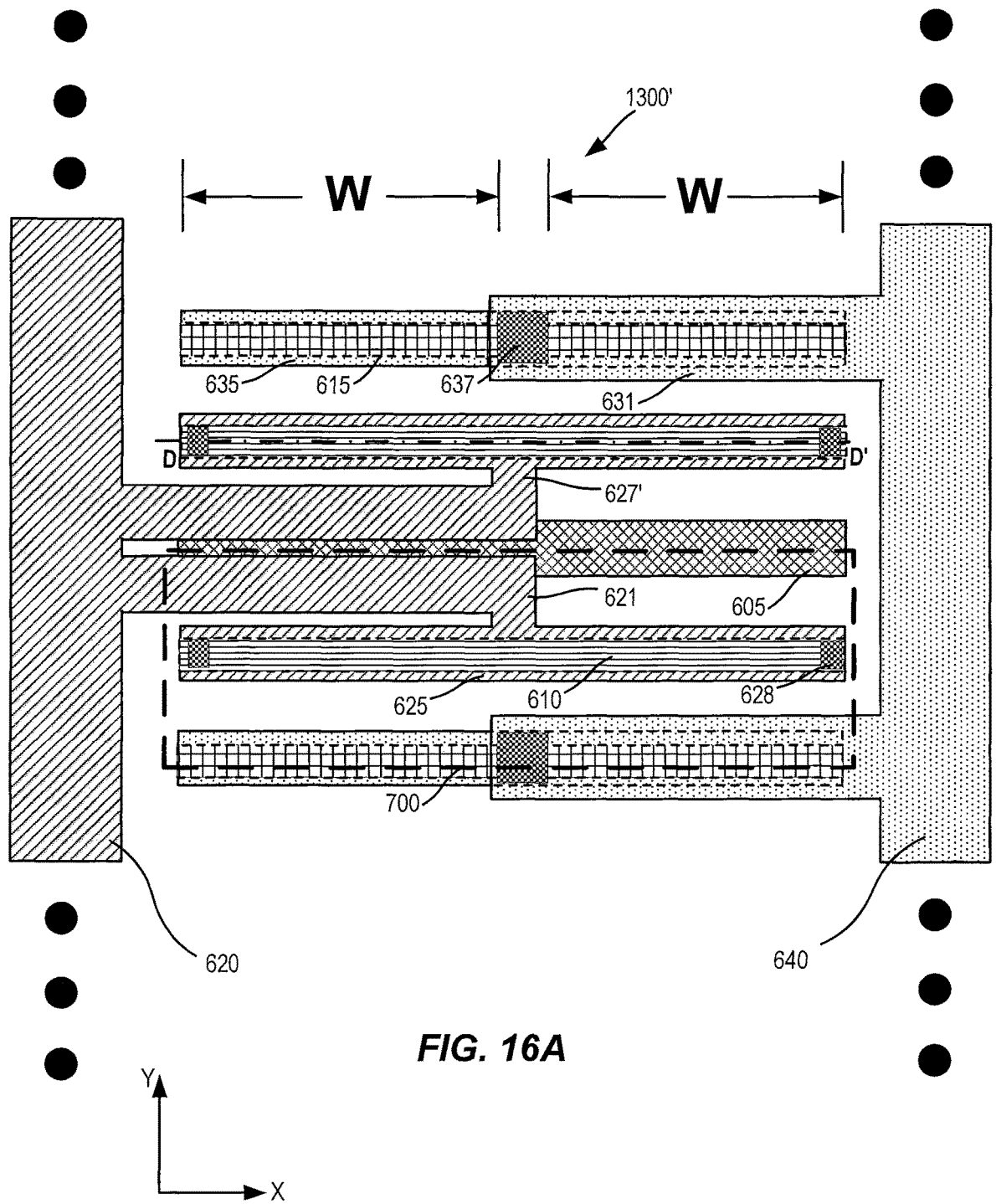
FIG. 16A is a plan view illustrating a transistor device incorporating an edge-fed gate finger in which the gate runner extends over a source region.
Figure 16B:
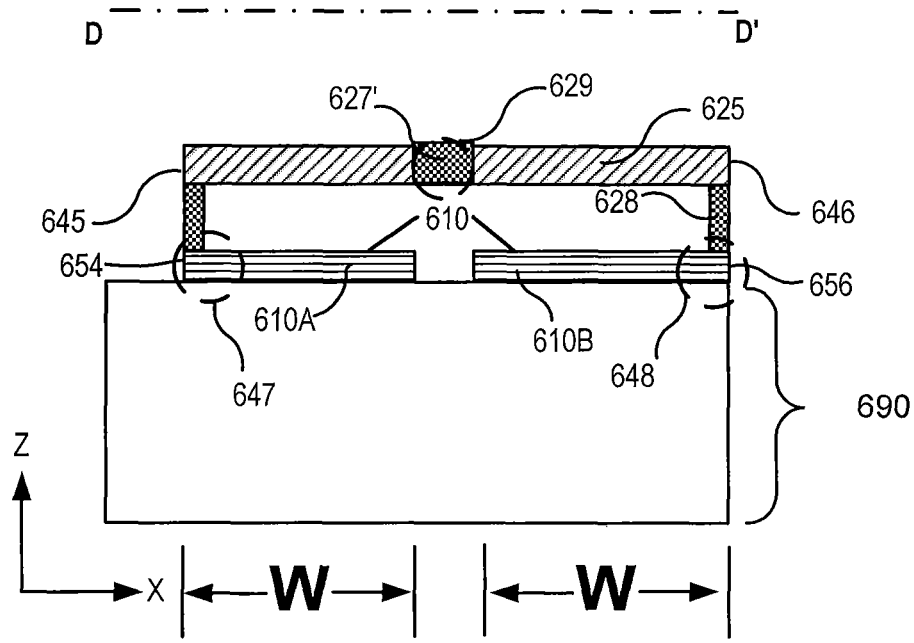
FIG. 16B is a cross section of FIG. 16A taken along the line D-D', according to some embodiments of the invention.
Figure 16C:
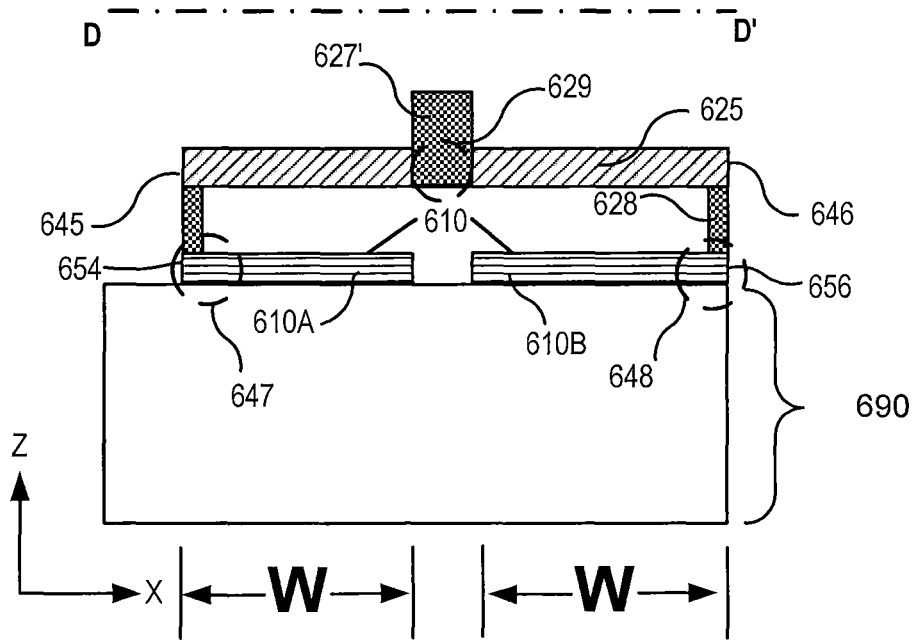
FIG. 16C is also a cross section of FIG. 16A taken along the line D-D', according to an additional embodiment of the invention.

As discussed herein with respect to the previous embodiments, embodiments of the present invention which incorporate an edge-fed gate and/or drain may be configured to extend at least a portion of the gate interconnect and/or gate runner over a source region. FIG. 16A is a plan view illustrating a transistor device 1300' incorporating an edge-fed gate finger 610 in which the gate runner 621 extends over a source region 605. FIG. 16B is a cross section of FIG. 16A taken along the line D-D', according to some embodiments of the invention. FIG. 16C is also a cross section of FIG. 16A taken along the line D-D', according to an additional embodiment of the invention. Elements of FIGS. 16A-16C which are similar to those previously described are denoted with similar reference numbers, and duplicate descriptions thereof may be omitted.

As illustrated in FIG. 16A, in some embodiments, portions of the gate runner 621 and/or the gate interconnect 625 may extend over a source region 605 of the transistor device 1300'. Portions of the gate runner 621 and/or the gate interconnect 625 may be offset (e.g., in the Y direction) from the gate finger 610. For example, as illustrated in FIGS. 16A and 16B, the gate runner 621 may extend over the source region 605 adjacent the gate finger 610. The gate runner 621 may connect to the gate interconnect 625 at an interior position 629 of the gate interconnect 625. The interior position 629 may be between a first end 645 and a second end 646 of the gate interconnect 625. In some embodiments, the interior position 629 may be at a midpoint of the gate finger 610. In some embodiments, the interior position 629 may be at a distance that is within ten percent of the length of the gate finger 610 from the midpoint of the gate finger 610. In some embodiments, the interior position 629 may be at a distance that is within twenty percent of the length of the gate finger 610 from the midpoint of the gate finger 610. In some embodiments, the interior position 629 may be at a distance that is between one-third and two-thirds of the distance between opposite ends of the gate finger 610.

The gate runner 621 may be connected to the gate interconnect 625 by a conductive portion 627'. In some embodiments, the conductive portion 627' may extend in a direction parallel to a surface of the semiconductor structure 690 (e.g., a Y direction) between the gate runner 621 and the gate interconnect 625.

In some embodiments, the gate finger 610 may be composed of a first gate finger segment 610A and a second gate finger segment 610B with a gap therebetween. In some embodiments, the first gate finger segment 610A and the gate finger second segment 610B may be arranged collinearly. The gate finger 610 may have opposite edges 654 and 656. The first opposite edge 654 may be located at an edge of the gate finger 610 that is closest to the gate manifold 620 (see FIG. 6A). The second opposite edge 656 may be located at an edge of the gate finger 610 that is closest to the drain manifold 640 (see FIG. 6A). A first conductive via 628 between the gate interconnect 625 and the gate finger 610 may be connected to the gate finger 610 at a first position 647 that is offset from the first opposite edge 654, and a second conductive via 628 between the gate interconnect 625 and the gate finger 610 may be connected to the gate finger 610 at second position 648 that is offset from the second opposite edge 656 of the gate finger 610. Though FIG. 16A illustrates the conductive vias 628 offset from the opposite edges 654, 656 by an amount that is substantially zero, it will be understood that the present invention is not limited thereto, and the conductive vias 628 may be offset from the opposite edges 654, 656 of the gate finger 610 by a non-zero distance. Thus, the connection between the gate interconnect 625 and the gate finger 610 may be substantially similar to that discussed herein with respect to FIG. 14A.

The gate runner 621 may be disposed at a same level as the gate interconnect 625, as illustrated in FIG. 16B, but the embodiments described herein are not limited thereto. For example, as illustrated in FIG. 16C, the gate runner 621 may be disposed at a different level than the gate interconnect 625. In such embodiments, the conductive portion 627' may also extend in direction perpendicular to the top surface of the semiconductor structure 690 (e.g., the Z direction).

Figure 17A:
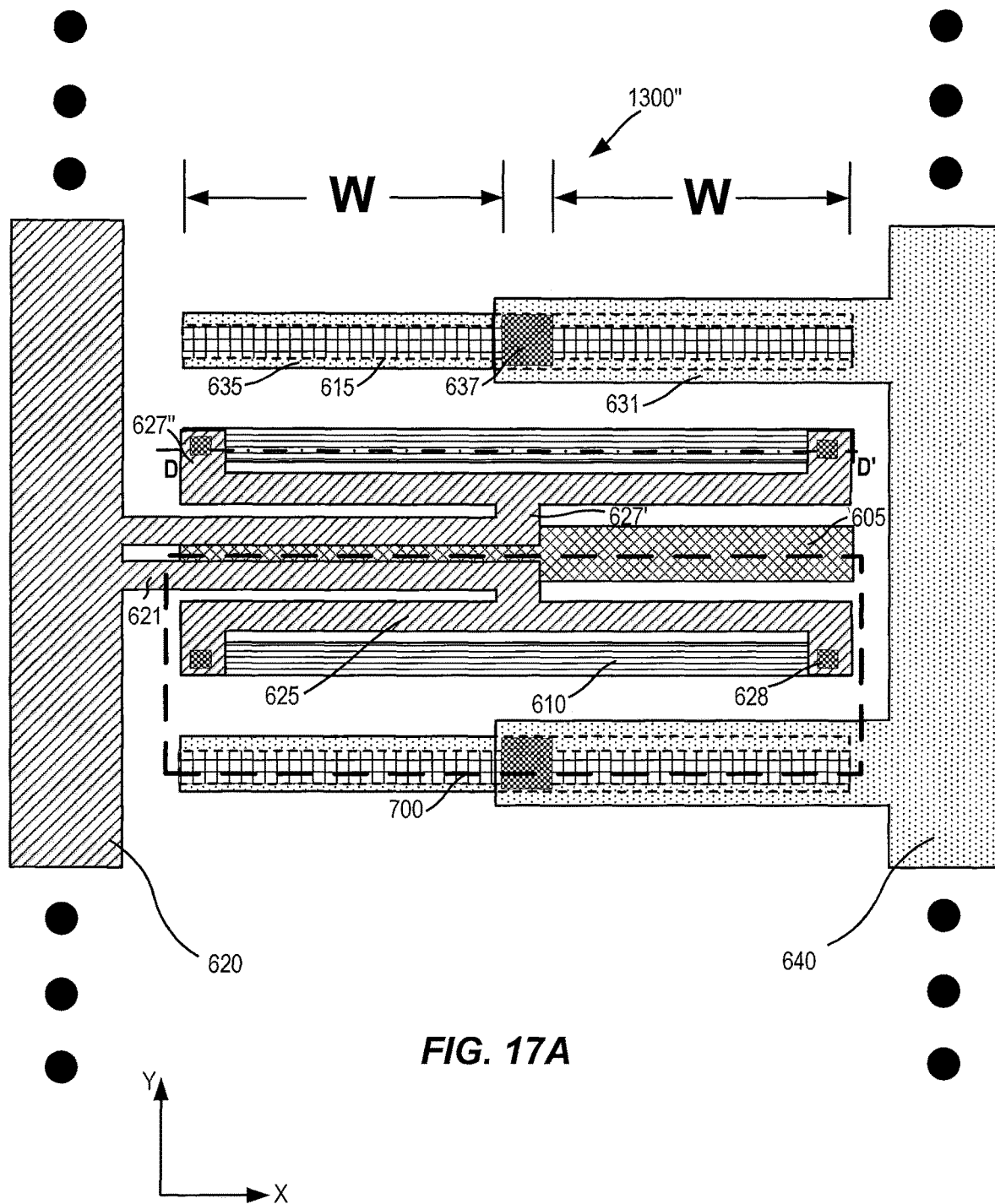
FIG. 17A illustrates an embodiment in which both the gate runner and the gate interconnect extend over an area of the semiconductor structure that is adjacent to the gate finger.
Figure 17B:
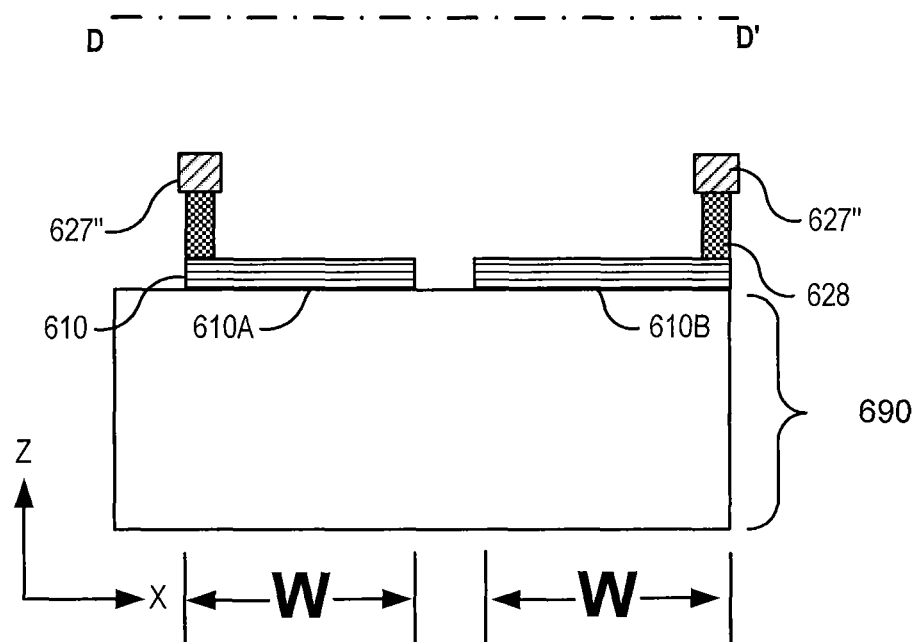
FIG. 17B illustrates a cross section of 17A taken along the line D-D', according to embodiments of the present invention.

Though FIGS. 16A-16C illustrate embodiments in which the gate interconnect 625 extends over the gate finger 610, it will be understood that the present invention is not limited thereto. In some embodiments, portions of the gate interconnect 625 may extend on portions of the semiconductor substrate that are between the gate finger 610 and an adjacent source region. FIG. 17A illustrates an embodiment of a transistor device 1300" in which both the gate runner 621 and the gate interconnect 625 extend over an area of the semiconductor structure that is adjacent to the gate finger. FIG. 17B illustrates a cross section of 17A taken along the line D-D', according to embodiments of the present invention.

As shown in FIG. 17A, the gate runner 621 may extend, in part, over a source region 605 that is adjacent to the gate finger 610. The gate runner 621 may be connected to the gate interconnect 625 via a first conductive portion 627'. In some embodiments, the first conductive portion 627' may extend in a direction parallel to a surface of the semiconductor structure 690 (e.g., a Y direction) between the gate runner 621 and the gate interconnect 625. In some embodiments, the first conductive portion 627' may be composed of a same or similar material as the gate runner 621.

The gate interconnect 625 may also extend over a portion of the semiconductor structure 690 that is adjacent to the gate finger 610. In some embodiments, the gate interconnect 625 may extend over a portion of the semiconductor structure 690 between the gate finger 610 and the source region 105. In some embodiments, the gate interconnect 625 may extend over a portion of the source region 105.

The gate interconnect may be connected to the gate finger 610, in part, through a second conductive portion 627". The second conductive portion 627" may extend between the gate interconnect 625 and the conductive via 628. As illustrated in FIG. 17B, conductive via 628 may be coupled to an edge portion E of the gate finger 610 as discussed herein, e.g., with respect to FIG. 14A.

The gate runner 621 and the gate interconnect 625 may be disposed at different heights. In some embodiments at least a portion of the gate runner 621 may overlap a portion of the gate interconnect 625. In some embodiments, both the gate runner 621 and the gate interconnect 625 may comprise a metal, though the present invention is not limited thereto. In some embodiments, a cross section of the gate runner 621 may have a greater dimension (e.g., in the Y direction) that is greater than a cross section of the gate interconnect 625.

Embodiments as described herein may allow for the segmented gate fingers 610 that are arranged collinearly to nonetheless operate as if they were arranged in parallel, while the drain is operated in an interior-fed fashion. In some embodiments, this configuration may allow each gate finger of the transistor having a 2W width to operate as a pair of shorter gate fingers in parallel, each having a W width, but without doubling the number of fingers. This configuration may retain the benefit of lower gate resistance, producing a higher gain while producing the same high power.

The edge-fed gate fingers with center-fed drain fingers follow the energy propagation direction of the device and allows for the current summation to be done in-phase. This will contribute to preserving the RF performance of shorter fingers in terms of output power density and efficiency. In some embodiments, similar benefits may be obtained through the use of center-fed gate fingers with edge-fed drain fingers.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
a semiconductor structure;
a gate finger extending on the semiconductor structure in a first direction;
a gate interconnect extending on the semiconductor structure in the first direction, the gate interconnect having a first end and a second end;
a first conductive via coupled between the gate interconnect and the gate finger; and
a second conductive via coupled to the gate interconnect at an interior position of the gate interconnect that is offset from the first and second ends of the gate interconnect,
wherein the second conductive via connects to an upper side of the gate interconnect and the first conductive via connects to a lower side of the gate interconnect.

2. The transistor device of claim 1, wherein the second conductive via is configured to deliver a gate signal to the gate interconnect.

3. The transistor device of claim 1, wherein the interior position of the gate interconnect is located at a point that is within twenty percent of a length of the gate interconnect from a midpoint between the first and second ends of the gate interconnect.

4. The transistor device of claim 1, wherein the first conductive via is coupled to the gate finger at a first location that is adjacent a first edge of the gate finger.

5. The transistor device of claim 1, further comprising a gate runner extending on the semiconductor structure in the first direction,
wherein the gate interconnect is connected to the gate runner by the second conductive via.

6. The transistor device of claim 5, wherein the gate finger extends on the semiconductor structure at a first level above the semiconductor structure, the gate interconnect extends on the semiconductor structure at a second level above the semiconductor structure that is higher than the first level, and the gate runner extends on the semiconductor structure at a third level above the semiconductor structure that is equal to or higher than the second level.

7. A transistor device, comprising:
a semiconductor structure;
a gate finger extending on the semiconductor structure in a first direction, the gate finger comprising a first segment and a second segment; and
a gate runner extending on the semiconductor structure and configured to provide a gate signal symmetrically to the first segment and the second segment of the gate finger.

8. The transistor device of claim 7, wherein the gate runner is configured to provide the gate signal such that a first transmission distance of the gate signal along the gate runner and the first segment of the gate finger is substantially the same as the a second transmission distance of the gate signal along the gate runner and the second segment of the gate finger.

9. The transistor device of claim 7, wherein the gate runner is coupled to an interior position of the gate finger that is offset from a first end and a second end of the gate finger.

10. The transistor device of claim 7, further comprising a gate interconnect extending on the semiconductor structure in the first direction, wherein the gate runner is coupled to an interior position of the gate interconnect that is offset from a first end and a second end of the gate interconnect.

11. The transistor device of claim 10, wherein the gate finger comprises edge portions at opposite edges of the gate finger with a central portion between the edge portions, and
wherein the gate interconnect is connected to the edge portions of the gate finger.

12. The transistor device of claim 11, wherein the gate interconnect is connected to the edge portions of the gate finger via at least one conductive via, and
wherein the gate finger is free of a conductive via connected to the central portion of the gate finger.

13. The transistor device of claim 7, wherein the first and second segments are collinear.

14. The transistor device of claim 13, further comprising a gap between the first and second segments.

15. A transistor device, comprising:
a semiconductor structure comprising a source region and a drain region;
a gate finger extending on the semiconductor structure in a first direction between the source region and the drain region;
a gate interconnect extending on the semiconductor structure in the first direction and connected to the gate finger; and
a gate runner extending on the semiconductor structure in the first direction and connected to the gate interconnect at an interior position that is offset from first and second ends of the gate interconnect.

16. The transistor device of claim 15, wherein at least a portion of the gate runner extends above the source region.

17. The transistor device of claim 15, wherein the gate finger comprises a first segment and a second segment, with a gap therebetween.

18. The transistor device of claim 17, wherein the interior position of the gate interconnect vertically overlaps the gap.

19. The transistor device of claim 15, wherein the interior position of the gate interconnect is between one-third and two-thirds of a distance between the first end and the second end of the gate interconnect.

20. The transistor device of claim 15, wherein the gate runner is a first gate runner, the first gate runner having a third end and a fourth end,
wherein the interior position is a first interior position,
wherein the transistor device further comprises a second gate runner extending on the semiconductor structure in the first direction, and
wherein the second gate runner is connected to the first gate runner at a second interior position of the first gate runner that is offset from the third end and the fourth end of the first gate runner.

* * * * *